US011735288B1

(12) United States Patent
Hsu et al.

(10) Patent No.: US 11,735,288 B1
(45) Date of Patent: Aug. 22, 2023

(54) NON-VOLATILE STORAGE SYSTEM WITH POWER ON READ TIMING REDUCTION

(71) Applicant: SanDisk Technologies LLC, Addison, TX (US)

(72) Inventors: Hua-Ling Cynthia Hsu, Fremont, CA (US); YenLung Li, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 17/672,904

(22) Filed: Feb. 16, 2022

(51) Int. Cl.
*G11C 29/50* (2006.01)

(52) U.S. Cl.
CPC ............. *G11C 29/50004* (2013.01); *G11C 2029/5004* (2013.01)

(58) Field of Classification Search
CPC ................ G11C 29/50004; G11C 2029/5004
See application file for complete search history.

(56) References Cited

U.S. PATENT DOCUMENTS

| | | | |
|---|---|---|---|
| 7,911,872 B2 | 3/2011 | Lakhani et al. | |
| 8,711,625 B2 | 4/2014 | Li et al. | |
| 8,842,473 B2 | 9/2014 | Tsai | |
| 9,146,807 B2 | 9/2015 | Yurzola et al. | |
| 9,792,175 B2 | 10/2017 | Sharma et al. | |
| 11,004,535 B1 | 5/2021 | Hsu et al. | |
| 11,152,079 B2 | 10/2021 | Bassa et al. | |
| 2004/0153900 A1* | 8/2004 | Adams | G11C 29/802 714/710 |
| 2008/0065929 A1* | 3/2008 | Nadeau-Dostie | G11C 29/802 714/E11.054 |
| 2008/0266957 A1 | 10/2008 | Moogat et al. | |
| 2012/0182816 A1* | 7/2012 | Ide | G11C 29/56008 438/15 |
| 2013/0242655 A1 | 9/2013 | Tsai | |

* cited by examiner

*Primary Examiner* — Mohammed A Bashar
(74) *Attorney, Agent, or Firm* — Vierra Magen Marcus LLP

(57) ABSTRACT

Technology is disclosed herein for loading redundancy information during a memory system power on read (POR). A memory structure has primary regions (e.g., primary columns) and a number of redundant regions (e.g., redundant columns). The status of the regions is stored in isolation latches during the POR. Initially, simultaneously all latches for primary regions are reset to used and all latches for redundant regions are reset to unused. Then, isolation latches for defective primary regions are set to unused while isolation latches for corresponding redundant regions are set to used. There is no need to individually set isolation latches for redundant regions to unused, which saves time during POR. Moreover, whenever the isolation latch for a defective primary region is set from used to unused, in parallel the isolation latch for the replacement redundant column may be set from unused to used, thereby not incurring a time penalty.

20 Claims, 15 Drawing Sheets

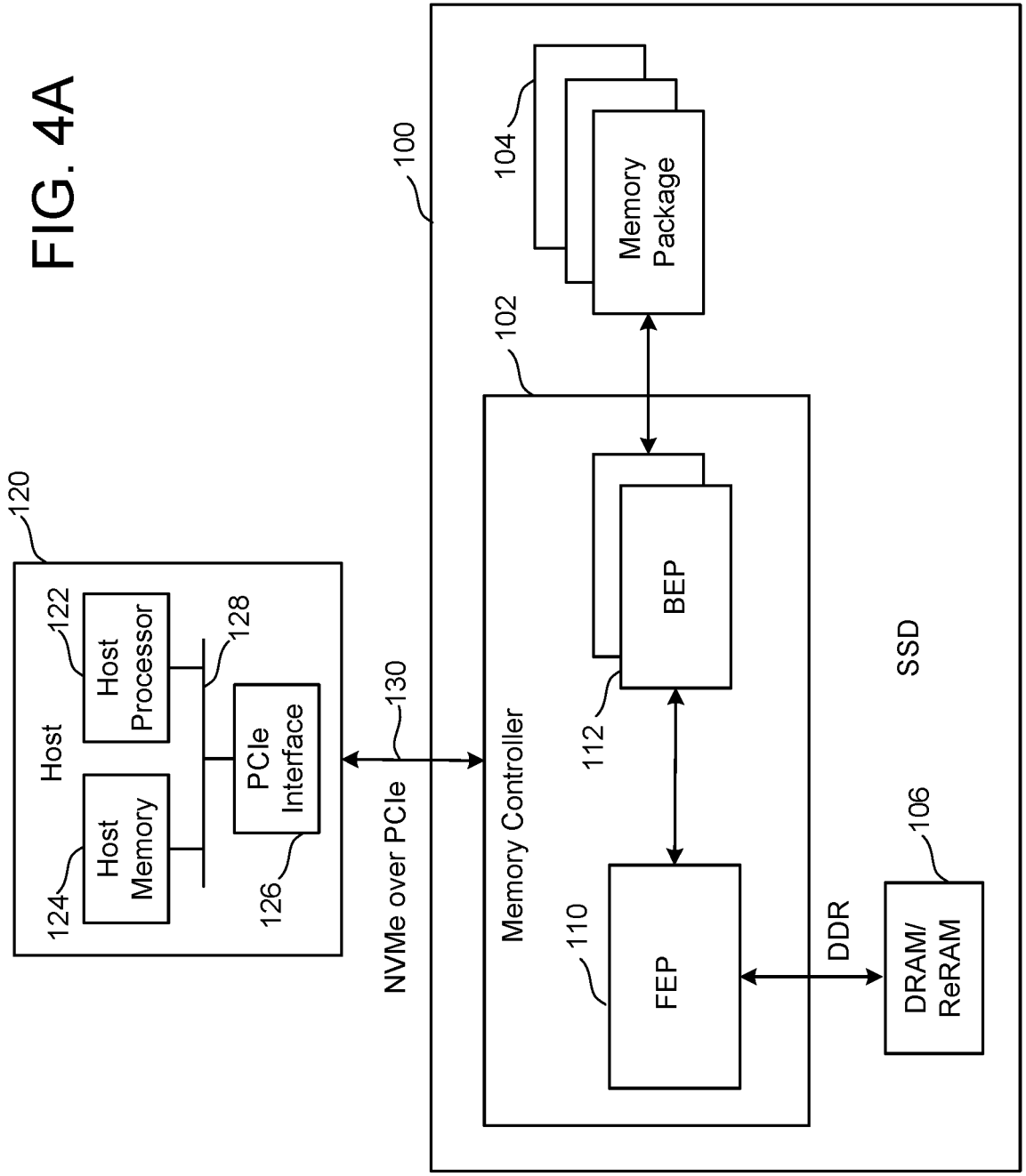

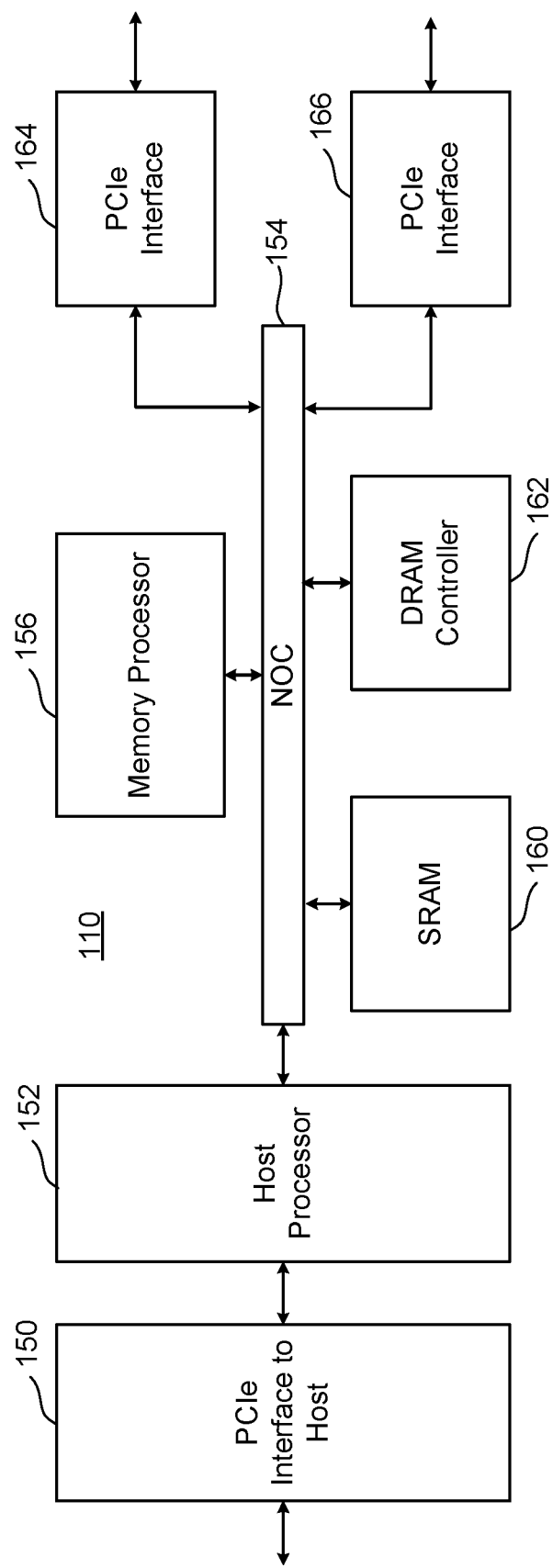

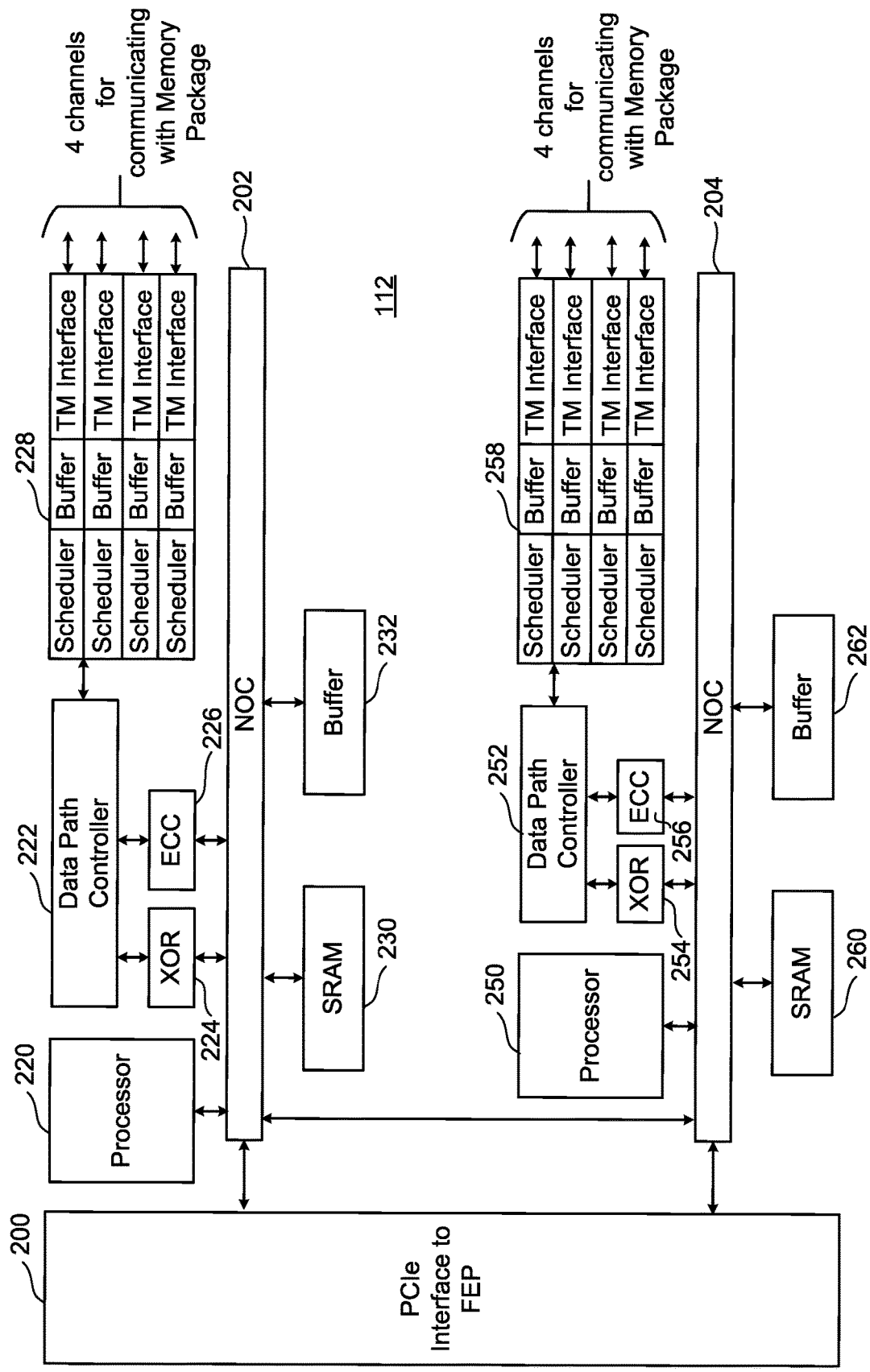

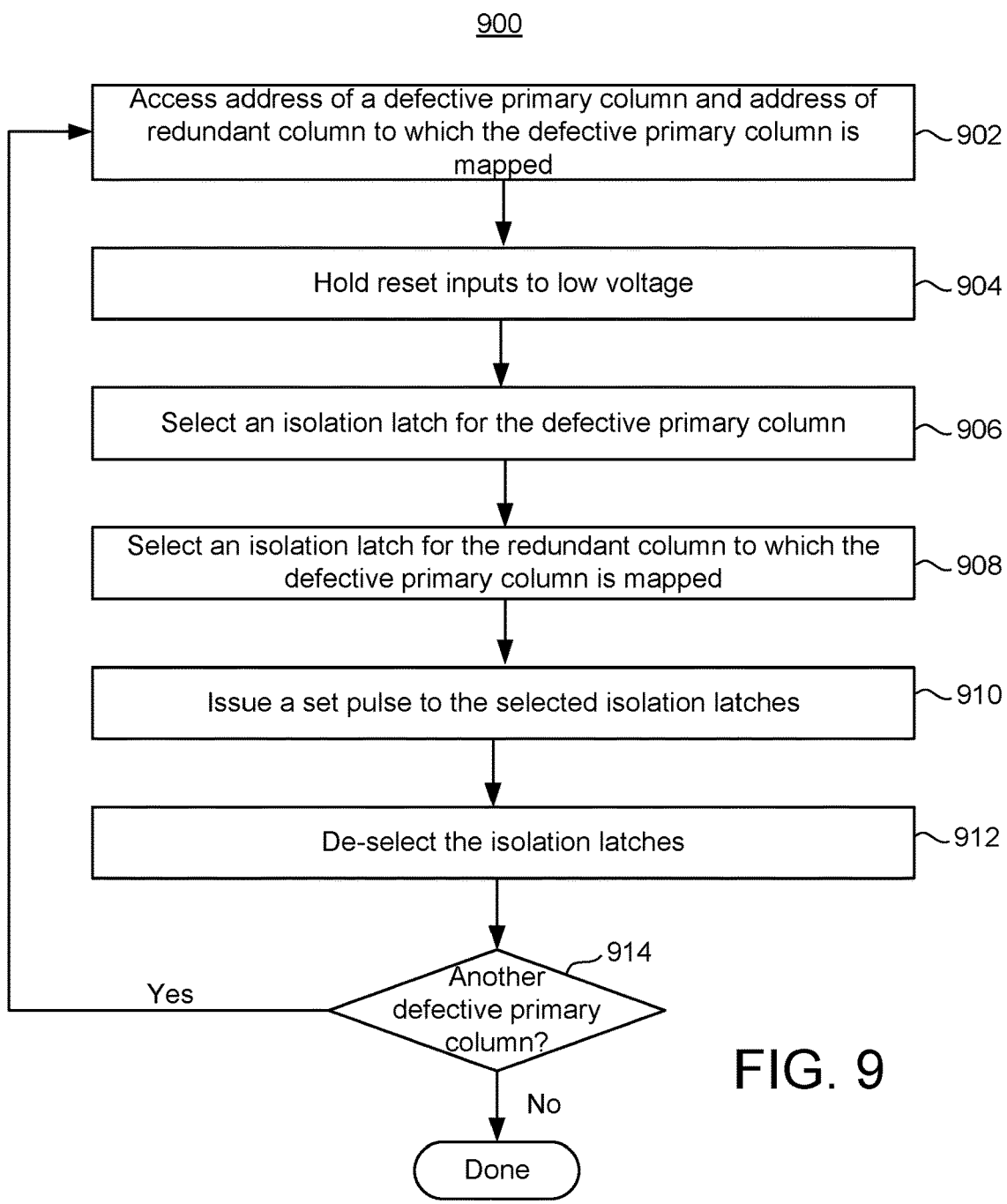

NON-VOLATILE STORAGE SYSTEM WITH POWER ON READ TIMING REDUCTION

BACKGROUND

Semiconductor memory is widely used in various electronic devices such as cellular telephones, digital cameras, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). An apparatus that includes a memory system, or is connected to a memory system, is often referred to as a host.

The memory system has one or more memory structures that each contain non-volatile memory cells. The memory structure can be arranged in rows (e.g., blocks) and columns. In a NAND architecture, a block may contain thousands of NAND strings, with each NAND string containing a series connection of non-volatile memory cells. The memory structure may contain a number of bit lines, which may connect to the NAND strings in order to sense the memory cells as well as to provide the data (i.e., bits) to be programmed into the memory cells. A column may correspond to a set of bit lines and the NAND strings associated with the set of bit lines. However, the concept of a column (as well as row) applies to memory structures other than NAND.

The memory structure is typically tested at the time of manufacture, before being shipped to the end user, to identify defective (bad) regions of the memory structure. The defects could include, but are not limited to, short circuits between adjacent bit lines, short circuits between adjacent word lines, etc. One technique for handling defective regions is to manufacture the memory structure with a number of redundant regions that can each serve as a replacement for a defective primary region. For example, there may be a number of redundant columns, which can each serve as a replacement for one defective primary column.

BRIEF DESCRIPTION OF THE DRAWINGS

Like-numbered elements refer to common components in the different figures.

FIG. 4A is a block diagram of one embodiment of a storage system connected to a host.

FIG. 4B is a block diagram of one embodiment of a Front-End Processor Circuit.

FIG. 4C is a block diagram of one embodiment of a Back-End Processor Circuit.

FIG. 8 is a flowchart of one embodiment of a process of resetting isolation latches.

FIG. 9 is a flowchart of one embodiment of a process of setting isolation latches.

DETAILED DESCRIPTION

Technology is disclosed herein for loading storage redundancy information during a power on read in a memory system. An embodiment includes a memory system having a memory structure that contains non-volatile memory cells. The memory structure is divided into a number of primary regions (e.g., columns) and a number of redundant regions (e.g., columns). The memory system contains isolation latches that each store the status of one of the regions. For example, an isolation latch that corresponds to a primary column may have an output that indicates whether the primary column is good (i.e., operational) or bad (i.e., defective). As isolation latch that corresponds to a redundant column may have an output that indicates whether the redundant column is used to replace a defective primary column or is unused (i.e., does not replace any of the primary columns). In an embodiment, the status of the regions is stored into the isolation latches during the power on read. Storing of the status of the regions into the isolation latches is performed efficiently to save time during the power on read. Therefore, tPOR may be reduced.

Figure 1:
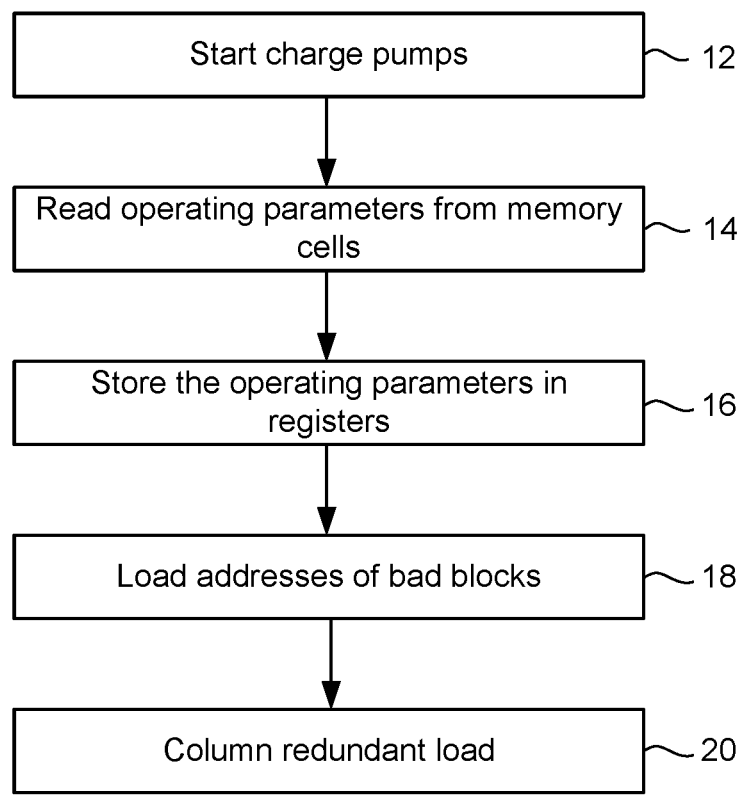
FIG. 1 depicts a flowchart of one possible power on read.

A memory die having the memory structure will from time to time undergo a power on sequence, in which information for operating the memory structure may be read from non-volatile memory cells in the memory structure. This sequence may be referred to as a power on read (POR). FIG. 1 depicts a flowchart of one embodiment of a POR. Step 12 includes starting charge pumps and waiting for charge pumps to power on. The charge pumps are used to supply voltages to the memory structure to, for example, read the memory cells. Step 14 includes reading a portion of the memory structure that stores operating parameters. These operating parameters may include parameters such as voltages used during program, erase, etc. Step 16 includes storing the operating parameters into temporary registers on the memory die. Step 18 include a bad block load. A bad (or defective) block is an example of a bad (or defective) region. Step 18 is used to load a list of which blocks in the memory structure are defective (bad). This list of bad blocks can be determined at time of manufacture based on device tests, and stored in non-volatile memory cells in a portion of the memory structure. Step 20 includes a column redundancy load. The column redundancy load is used to load information about which columns are bad (or defective). A bad (or defective) column is an example of a bad (or defective) region. This list of defective columns can be determined at time of manufacture based on device tests, and stored in non-volatile memory cells in a portion of the memory structure. In some techniques the memory structure contains a table that maps addresses of defective columns to addresses of redundant columns.

The time to perform the power on read (tPOR) is a significant performance parameter. The tPOR may be calculated based on a worst case assumption of the number of defective blocks and defective columns. For example, the time needed to complete the power on read may be longer if there are more defective blocks and/or defective columns. The worst case assumption may be used to assure that the memory die will complete the POR within the tPOR. Recently, there has been an increased desire to reduce the tPOR. Power can be saved by shutting down memory systems such as, but not limited to, solid state drives (SSDs). Therefore, memory systems such as SSDs may be shut down (and therefore powered on) more frequently. Therefore, for performance reasons it is desirable to reduce the tPOR.

Figure 2:
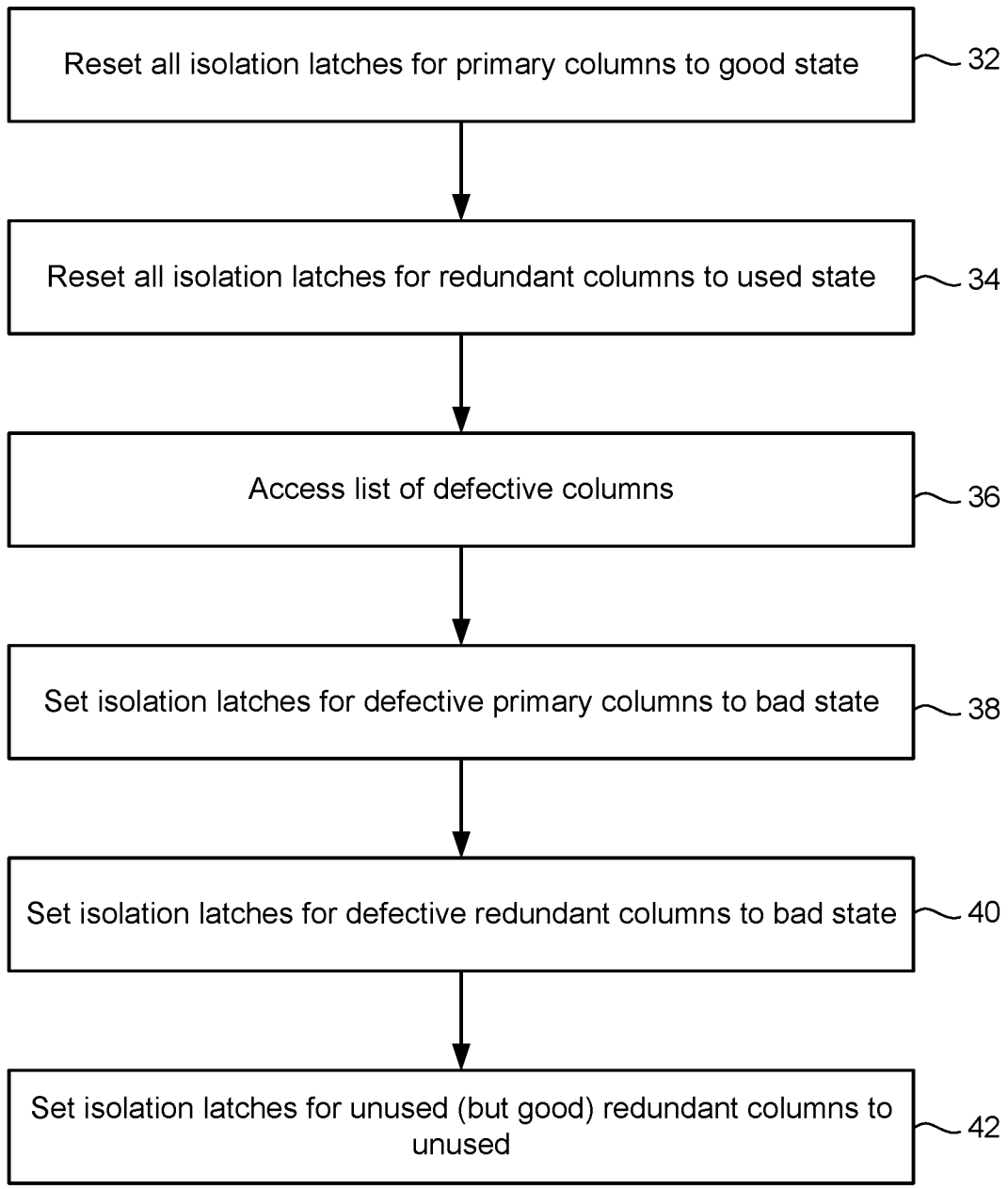
FIG. 2 depicts one possible technique for storing of the status of the columns into isolation latches during a power on read.

One possible technique for storing of the status of the columns into the isolation latches during the power on read is depicted in the flowchart of FIG. 2. Each isolation latch may have two output states (or more briefly "states"). The isolation latch may be reset to one state and set to the other state. In FIG. 2, these two states may be referred to as good (or used) and bad (or unused). For a primary column, the good state indicates that the primary column is good and will be used for memory operations. However, the bad state indicates that the primary column is defective (or bad) and will be not used for memory operations. An isolation latch for a redundant column will be set to good (or used) if the redundant column will be used as a replacement for a defective primary column. The isolation latch for a redundant column will be set to bad (or unused) if the redundant column will not be used as a replacement for any defective primary column.

Step 32 in FIG. 2 includes resetting all isolation latches for primary columns to the good (used) state. Step 34 includes resetting all isolation latches for redundant columns to a good (used) state. Steps 32 and 34 may be performed in parallel. Moreover, all of the latches can be reset simultaneously. Step 36 includes accessing a list of defective primary columns and defective redundant columns. Step 38 includes setting isolation latches for defective primary columns to the bad (unused) state. Step 40 includes setting isolation latches for defective redundant columns to the bad (unused) state.

Step 42 includes setting isolation latches for unused redundant columns to the bad (unused) state. In step 42, the setting of the isolation latches may be a sequential operation (i.e., latch by latch) due to some of the isolation latches being in the used state because the corresponding redundant column is used as a replacement for a defective primary column. Therefore, step 42 can be quite time consuming if there are a significant number of unused redundant columns. In many cases, there will be a significant number of unused redundant columns.

The process of FIG. 2 assumes a worst case in which all of the redundant columns will be used (see step 34). Then, in step 42, the isolation latches for all of the unused redundant columns are set to the bad (or unused) state. However, step 42 creates a significant overhead in timing if the majority of redundant columns are not used. For some memory systems, in almost all cases, significantly fewer than half of the redundant columns are used.

Figure 3:
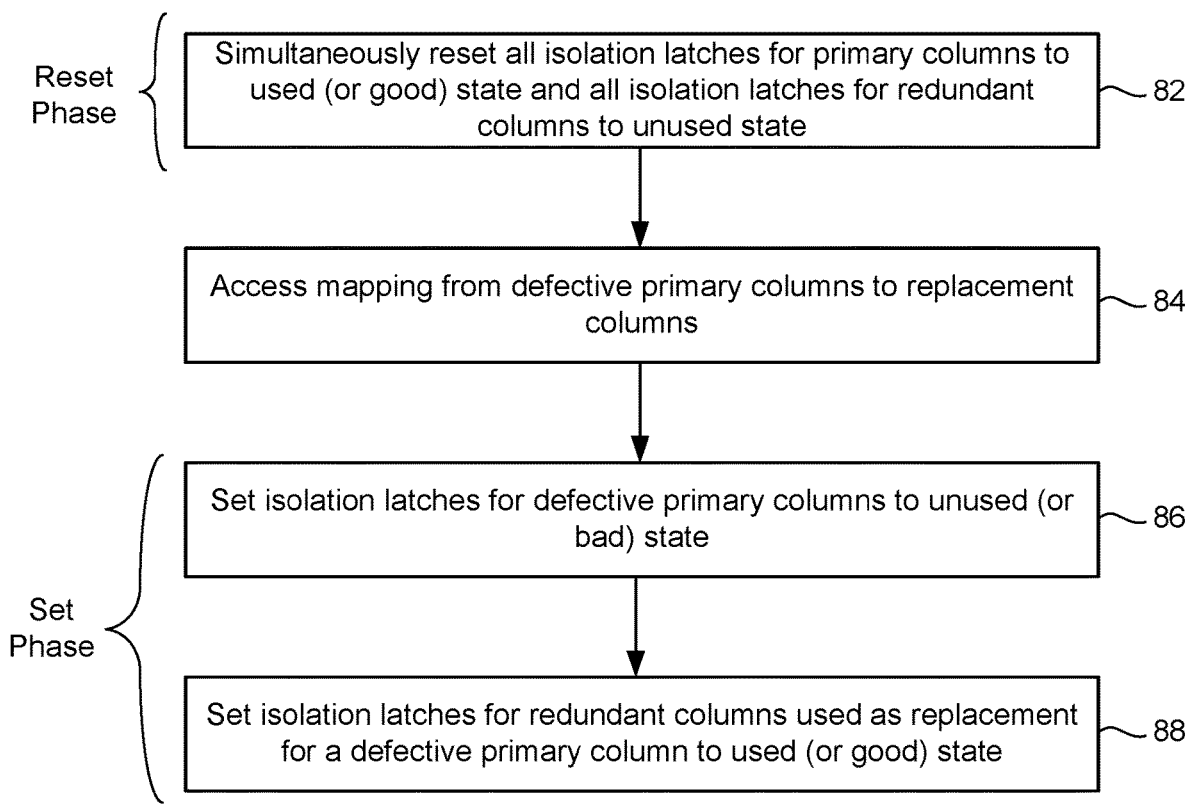
FIG. 3 is a flowchart of one embodiment of a process for storing of the status of the columns into isolation latches during the power on read.

FIG. 3 is a flowchart of one embodiment of a process for storing of the status of the columns into isolation latches during the power on read. In an embodiment, the process is performed during step 20 of FIG. 1. Thus, the process of FIG. 3 may be performed in response to powering on a die that contains the memory cells. Each isolation latch may have two output states. The isolation latch may be reset to one state and set to the other state. In FIG. 3, for a primary column, the good (or used) state indicates that the primary column is good and will be used for memory operations. However, the bad (or unused) state indicates that the primary column is defective (or bad) and will be not used for memory operations. The final state of the isolation latch for a redundant column will be set to used if the redundant column will be used as a replacement for a defective primary column. The final state of the isolation latch for a redundant column will be set to unused if the redundant column will not be used as a replacement for any defective primary column.

Step 82 includes simultaneously resetting all isolation latches for primary columns to the good state while resetting all isolation latches for the redundant columns to the unused state. Step 82 occurs during what is referred to herein as a reset phase of the power on read. The reset places all isolation latches into an initial (or default) state.

Step 84 includes accessing a mapping from defective primary columns to replacement columns. In one embodiment, the mapping is stored in non-volatile memory cells in the memory structure. The mapping may be accessed from the non-volatile memory cells in the memory structure (see memory structure 302 in FIGS. 5A, 5B) and stored into a column redundancy table in, for example, a periphery area of the memory die (see column redundancy table 370 in FIG. 5A). In one embodiment, the column redundancy table is located on a control die (see control die 311 in FIG. 5B). The storing of the mapping into the periphery area may be performed prior to the process of FIG. 3.

Step 86 includes setting isolation latches for defective primary columns to the bad (or unused) state. Step 88 includes setting isolation latches for used redundant columns to the used state. The used redundant columns referred to those that are used as replacements for the defective primary columns. Steps 86 and 88 occur during what is referred to herein as a set phase of the power on read. As will be described in more detail below, steps 86 and 88 can be performed in parallel. This allows the isolation latches to be set in step 88 without any time added to the time of setting the isolation latches in step 86.

Note that the process of FIG. 3 first resets the isolation latches to an initial state and then sets some of the isolation latches to a final state. This terminology of first resetting the isolation latches to an initial state and then setting the isolation latches from the initial state to a final state will be used throughout this document. However, the terms reset and set could be switched, such that the process could be alternatively (and equivalently) be described as first setting the isolation latches to an initial state and then resetting the isolation latches from the initial state to a final state. The term "place" may be used to refer to either set or reset. Thus, in one embodiment, the isolation latches are "placed" (meaning reset or set) into the initial state during a first phase of the POR and some of the isolation latches are "placed" (meaning set or reset) into the final state during the second phase of the POR.

Note that the isolation latches for redundant columns are initially reset to the unused state in step 82 of FIG. 3. Therefore, there is no need for a final step that sets isolation latches for unused redundant columns to the unused state, which results in a considerable time savings relative to the process in FIG. 2. As noted above, step 42 in FIG. 2 creates a significant overhead in timing if the majority of redundant columns are not used. This overhead is avoided in the process of FIG. 3, due to initially resetting the isolation latches for redundant columns to the unused state in step 82.

Moreover, in an embodiment, whenever the isolation latch for a defective primary column is set from the good state to the bad state (see step 86), in parallel the isolation latch for the replacement redundant column may be set from the unused state to the used state (see step 88). Therefore, step 88 of setting the isolation latches for the replacement redundant columns does not create any overhead to the time needed to set the isolation latches for defective primary columns set to the bad state (see step 86).

The following example will be used to illustrate possible time savings of the process of FIG. 3 relative to the process of FIG. 2. An example in which there are 100 redundant columns and 24 defective primary columns will be discussed. In this example, 76 of the redundant columns are unused. Therefore, in step 42 of FIG. 2, the isolation latches for these 76 unused redundant columns are set to the unused state. This is in addition to setting the isolation latches for the 24 defective primary columns to the bad state in step 38. Therefore, a total of 100 isolation latches are set in the process of FIG. 2 (in addition to the reset of all latches in steps 32 and 34). Moreover the set of the latches are sequential operations, unlike the resetting which may occur in parallel.

In the process in FIG. 3, there will also be 24 isolation latches set for the 24 defective primary columns (see step 86). However, in an embodiment, setting the corresponding isolation latches for the 24 used redundant columns does not add an additional overhead. That is, each time an isolation latch for the defective primary column is set the isolation latch for the corresponding redundant column may also be set. Moreover, because the 76 other isolation latches for the 76 unused redundant columns were reset to the unused state in step 82, there is no need for an extra step to set these latches to the unused state. In general, for the process of FIG. 2, regardless of the number of defective primary columns, there will always be a need to set 100 latches (given 100 redundant columns). However, for the process of FIG. 3, fewer defective primary columns leads to less time to set the latches. As noted, for many memory die, it is typical that in almost all cases a relatively small percentage of the redundant columns are used as replacements for defective primary columns.

Furthermore, the circuitry of the isolation latches for the primary columns may be very similar to the circuitry of the isolation latches for the redundant columns, which simplifies both the fabrication process and operation of the isolation latches. In one embodiment, the same control signal that is used to reset the latches for the primary columns is used to reset the latches for the redundant columns. In one embodiment, the same control signal that is used to set the latches for the primary columns is used to set the latches for the redundant columns.

FIG. 4A-FIG. 5D describe one example of a non-volatile storage system that can be used to implement the technology disclosed herein. FIG. 4A is a block diagram of one embodiment of a non-volatile storage system 100 connected to a host system 120. Storage system 100 can implement the technology disclosed herein. Many different types of storage systems can be used with the technology disclosed herein. One example storage system is a solid-state drive ("SSD"); however, other types of storage systems can also be used. Storage system 100 comprises a memory controller 102, memory package 104 for storing data, and local memory (e.g. DRAM/ReRAM) 106. Memory controller 102 comprises a Front-End Processor Circuit (FEP) 110 and one or more Back-End Processor Circuits (BEP) 112. In one embodiment FEP 110 circuit is implemented on an ASIC. In one embodiment, each BEP circuit 112 is implemented on a separate ASIC. The ASICs for each of the BEP circuits 112 and the FEP circuit 110 are implemented on the same semiconductor die such that the memory controller 102 is manufactured as a System on a Chip ("SoC"). FEP 110 and BEP 112 both include their own processors. In one embodiment, FEP 110 and BEP 112 work as a master slave configuration where the FEP 110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory package 104 at the request of FEP circuit 110. For example, the BEP circuit 112 can carry out the read, erase, and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Memory controller 102 is one example of a control circuit.

In one embodiment, there are a plurality of memory packages 104. Each memory package 104 may contain one or more dies that contain non-volatile memory cells (i.e., "memory dies"). A memory package 104 may also contain one or more control dies. A control die is a semiconductor die that contains one or more control circuits for operating (e.g., reading, erasing, writing) memory cells on a memory die. Herein the term, semiconductor die (or more succinctly "die") may be used to refer to either a memory die or a control die. In one embodiment, each memory die in the memory package 104 utilizes NAND flash memory (including two-dimensional NAND flash memory and/or three-dimensional NAND flash memory). In other embodiments, the memory package 104 can include other types of memory; for example, the memory package can include Phase Change Memory (PCM) memory.

In one embodiment, memory controller 102 communicates with host system 120 using an interface 130 that implements NVM Express (NVMe) over PCI Express (PCIe). For working with storage system 100, host system 120 includes a host processor 122, host memory 124, and a PCIe interface 126, which communicate over bus 128. Host memory 124 is the host's physical memory, and can be DRAM, SRAM, non-volatile memory, or another type of storage. Host system 120 is external to and separate from storage system 100. In one embodiment, storage system 100 is embedded in host system 120. In other embodiments, the controller 102 may communicate with host 120 via other types of communication buses and/or links, including for example, over an NVMe over Fabrics architecture, or a cache/memory coherence architecture based on Cache Coherent Interconnect for Accelerators (CCIX), Compute Express Link (CXL), Open Coherent Accelerator Processor Interface (OpenCAPI), Gen-Z and the like. For simplicity, the example embodiments below will be described with respect to a PCIe example.

FIG. 4B is a block diagram of one embodiment of FEP circuit 110. FIG. 4B shows a PCIe interface 150 to communicate with host system 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use un-clocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 4B, memory controller 102 includes two BEP circuits 112; therefore, there are two PCIe Interfaces 164/166. Each PCIe Interface communicates with one of the BEP circuits 112. In other embodiments, there can be more or fewer than two BEP circuits 112; therefore, there can be more than two PCIe Interfaces.

FIG. 4C is a block diagram of one embodiment of the BEP circuit 112. FIG. 4C shows a PCIe Interface 200 for communicating with the FEP circuit 110 (e.g., communicating with one of PCIe Interfaces 164 and 166 of FIG. 4B). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254), an ECC engine (226/256).

The ECC engines 226/256 are used to perform error correction, as known in the art. Herein, the ECC engines 226/256 may be referred to as controller ECC engines. The XOR engines 224/254 are used to XOR the data so that data can be combined and stored in a manner that can be recovered in case there is a programming error. In an embodiment, the XOR engines 224/254 can recover data that cannot be decoded using ECC engine 226/256.

Data path controller 222 is connected to a memory interface 228 for communicating via four channels with integrated memory assemblies. Thus, the top NOC 202 is associated with memory interface 228 for four channels for communicating with integrated memory assemblies and the bottom NOC 204 is associated with memory interface 258 for four additional channels for communicating with integrated memory assemblies. In one embodiment, each memory interface 228/258 includes four Toggle Mode interfaces (TM Interface), four buffers and four schedulers. There is one scheduler, buffer, and TM Interface for each of the channels. The processor can be any standard processor known in the art. The data path controllers 222/252 can be a processor, FPGA, microprocessor, or other type of controller. The XOR engines 224/254 and ECC engines 226/256 are dedicated hardware circuits, known as hardware accelerators. In other embodiments, the XOR engines 224/254, ECC engines 226/256 can be implemented in software. The scheduler, buffer, and TM Interfaces are hardware circuits. In other embodiments, the memory interface (an electrical circuit for communicating with memory dies) can be a different structure than depicted in FIG. 4C. Additionally, controllers with structures different than FIGS. 4B and 4C can also be used with the technology described herein.

Figure 4D:
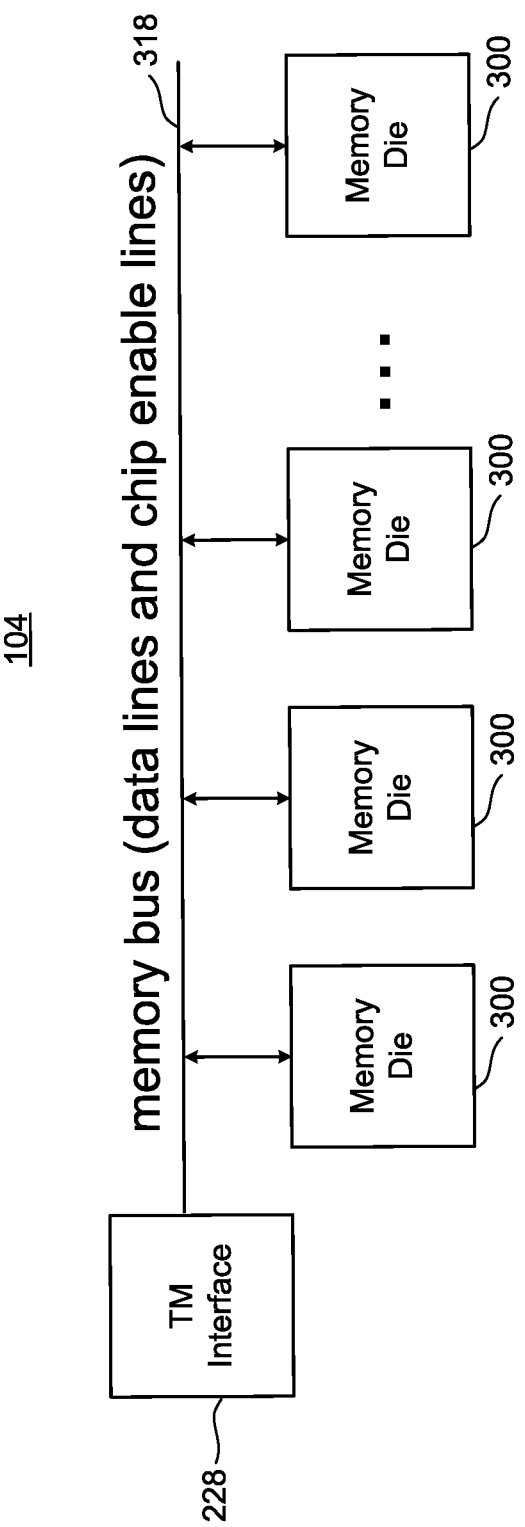
FIG. 4D is a block diagram of one embodiment of a memory package.

FIG. 4D is a block diagram of one embodiment of a memory package 104 that includes a plurality of memory dies 300 connected to a memory bus (data lines and chip enable lines) 318. The memory bus 318 connects to a Toggle Mode Interface 228 for communicating with the TM Interface of a BEP circuit 112 (see e.g., FIG. 4C). In some embodiments, the memory package can include a small controller connected to the memory bus and the TM Interface. In total, the memory package 104 may have eight or 16 memory die; however, other numbers of memory dies can also be implemented. The technology described herein is not limited to any particular number of memory dies. In some embodiments, the memory package can also include a processor, CPU device, such as a RISC-V CPU along with some amount of RAM to help implement some of capabilities described below. The technology described herein is not limited to any particular number of memory die.

Figure 5A:
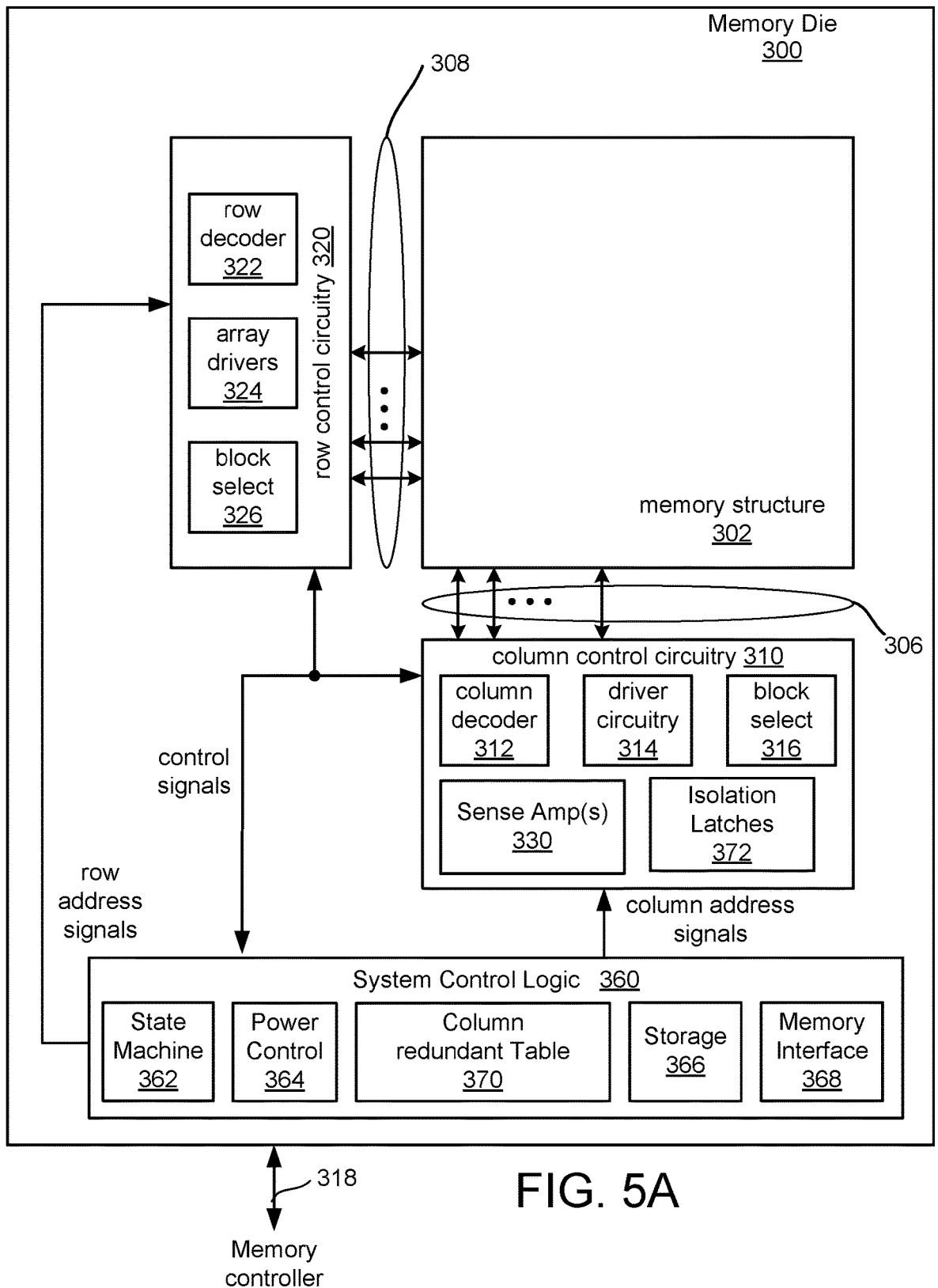
FIG. 5A is a functional block diagram of an embodiment of a memory die.

FIG. 5A is a block diagram that depicts one example of a memory die 300 that can implement the technology described herein. Memory die 300, which can correspond to one of the memory die 300 of FIG. 4D, includes a memory array 302 that can include any of memory cells described in the following. The array terminal lines of memory array 302 include the various layer(s) of word lines organized as rows, and the various layer(s) of bit lines organized as columns. However, other orientations can also be implemented. Memory die 300 includes row control circuitry 320, whose outputs 308 are connected to respective word lines of the memory array 302. Row control circuitry 320 receives a group of M row address signals and one or more various control signals from System Control Logic circuit 360, and typically may include such circuits as row decoders 322, array terminal drivers 324, and block select circuitry 326 for both reading and writing operations. Row control circuitry 320 may also include read/write circuitry. Memory die 300 also includes column control circuitry 310 including sense amplifier(s) 330 whose input/outputs 306 are connected to respective bit lines of the memory array 302. In some embodiments, the sense amp(s) contain data latches that store data to be programmed into the memory array 302. Although only single block is shown for array 302, a memory die can include multiple arrays that can be individually accessed. Column control circuitry 310 receives a group of N column address signals and one or more various control signals from System Control Logic 360, and typically may include such circuits as column decoders 312, array terminal receivers or drivers 314, block select circuitry 316, as well as read/write circuitry, and I/O multiplexers.

The memory structure 302 is divided into primary regions (e.g., primary rows, primary columns) and redundant regions (redundant rows, redundant columns). In the event that a primary region is defective one of the redundant regions will serve as a replacement for the defective primary column. For example, in the event that a primary column is defective one of the redundant columns will serve as a replacement for the defective primary column. The column control circuitry 310 has isolation latches 372. Each isolation latch 372 corresponds to a column of the memory structure 302 and indicates a state of that column. In an embodiment, the isolation latches 372 contain a first set of isolation latches that each correspond to a primary column and a second set of isolation latches that each correspond to a redundant column. Details of setting and resetting the isolation latches 372 are discussed below. In one embodiment, the row control circuitry 320 has isolation latches that serve a similar purpose for defective rows (e.g., defective blocks).

System control logic 360 receives data and commands from a host and provides output data and status to the host. In other embodiments, system control logic 360 receives data and commands from a separate controller circuit and provides output data to that controller circuit, with the controller circuit communicating with the host. In some embodiments, the system control logic 360 can include a state machine 362 that provides die-level control of memory operations. In one embodiment, the state machine 362 is programmable by software. In other embodiments, the state machine 362 does not use software and is completely implemented in hardware (e.g., electrical circuits). In another embodiment, the state machine 362 is replaced by a micro-controller or microprocessor, either on or off the memory chip. The system control logic 360 can also include a power control module 364 that controls the power and voltages supplied to the rows and columns of the memory structure 302 during memory operations and may include charge pumps and regulator circuit for creating regulating voltages.

System control logic 360 includes storage 366, which may be used to store parameters for operating the memory array 302. The storage 366 may include volatile and/or non-volatile storage. The storage 366 may include one or more registers, which may be used to store operating parameters. In one embodiment, the parameters are stored in the memory array 302 and transferred to the storage 366 upon power up of the memory die 300 (during a power on read).

System control logic 360 includes a column redundancy table 370, which stores a mapping from each defective primary column in the memory structure 302 to a corresponding redundant column that will serve as a replacement to the defective primary column. In an embodiment, a copy of this mapping is stored in non-volatile memory cells in the memory structure 302 and loaded into the column redundancy table 370 during power on of the memory die 300. The column redundancy table 370 may be stored in volatile or non-volatile memory. In an embodiment, a copy of the column redundancy table 370 is stored in the memory controller 102.

Commands and data are transferred between the controller 102 and the memory die 300 via memory controller interface 368 (also referred to as a "communication interface"). Memory controller interface 368 is an electrical interface for communicating with memory controller 102. Examples of memory controller interface 368 include a Toggle Mode Interface and an Open NAND Flash Interface (ONFI). Other I/O interfaces can also be used. For example, memory controller interface 368 may implement a Toggle Mode Interface that connects to the Toggle Mode interfaces of memory interface 228/258 for memory controller 102. In one embodiment, memory controller interface 368 includes a set of input and/or output (I/O) pins that connect to the controller 102.

In one embodiment, memory structure 302 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping.

In another embodiment, memory structure 302 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 302 is not limited to the examples above. Many different types of memory array architectures or memory technologies can be used to form memory structure 302. No particular non-volatile memory technology is required for purposes of the new claimed embodiments proposed herein. Other examples of suitable technologies for memory cells of the memory structure 302 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 302 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe-Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 5A can be grouped into two parts, the structure of memory structure 302 of the memory cells and the peripheral circuitry, including all of the other elements. An important characteristic of a memory circuit is its capacity, which can be increased by increasing the area of the memory die of storage system 100 that is given over to the memory structure 302; however, this reduces the area of the memory die available for the peripheral circuitry. This can place quite severe restrictions on these peripheral elements. For example, the need to fit sense amplifier circuits within the available area can be a significant restriction on sense amplifier design architectures. With respect to the system control logic 360, reduced availability of area can limit the available functionalities that can be implemented on-chip. Consequently, a basic trade-off in the design of a memory die for the storage system 100 is the amount of area to devote to the memory structure 302 and the amount of area to devote to the peripheral circuitry.

Another aspect in which the memory structure 302 and the peripheral circuitry are often at odds is in the processing involved in forming these areas, since these areas often involve differing processing technologies and the trade-off in having differing technologies on a single die. For example, when the memory structure 302 is NAND flash, this is an NMOS structure, while the peripheral circuitry is often CMOS based. For example, elements such sense amplifier circuits, charge pumps, logic elements in a state machine, and other peripheral circuitry in system control logic 360 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 5A onto separately formed dies that are then bonded together. More specifically, the memory structure 302 can be formed on one die and some or all of the peripheral circuitry elements, including one or more control circuits, can be formed on a separate die. For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate die. This allows each of the memory die to be optimized individually according to its technology. For example, a NAND memory die can be optimized for an NMOS based memory array structure, without worrying about the CMOS elements that have now been moved onto a separate peripheral circuitry die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other memory circuit. Although the following will focus on a bonded memory circuit of one memory die and one peripheral circuitry die, other embodiments can use more dies, such as two memory dies and one peripheral circuitry die, for example.

Figure 5B:
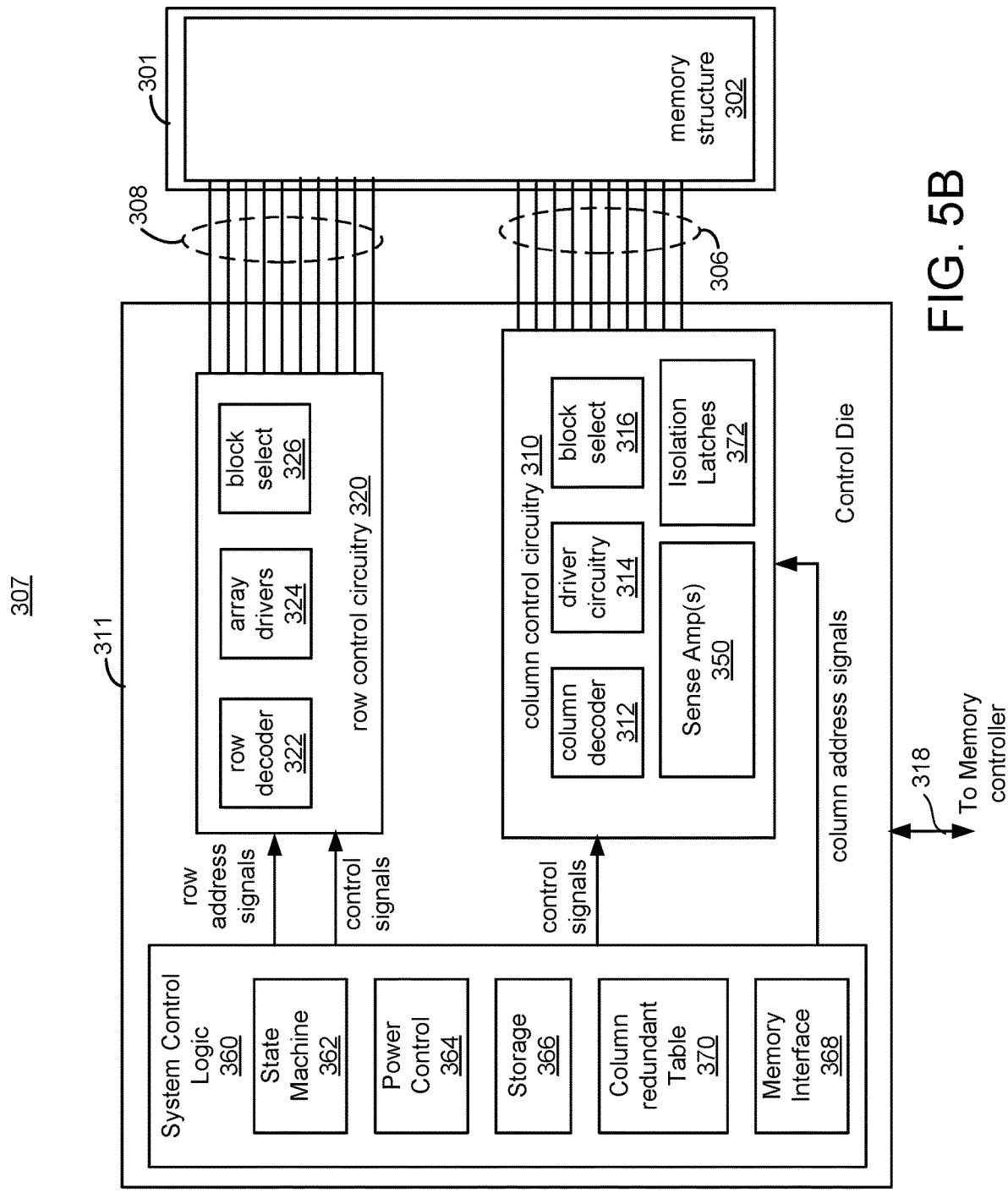
FIG. 5B is a functional block diagram of an embodiment of an integrated memory assembly.

FIG. 5B shows an alternative arrangement to that of FIG. 5A which may be implemented using wafer-to-wafer bonding to provide a bonded die pair. FIG. 5B depicts a functional block diagram of one embodiment of an integrated memory assembly 307. The integrated memory assembly 307 may be used in a memory package 104 in storage system 100. In one embodiment, each memory die 300 in FIG. 4D is replaced by an integrated memory assembly 307. The integrated memory assembly 307 includes two types of semiconductor dies (or more succinctly, "die"). Memory structure die 301 includes memory structure 302. Memory structure 302 may contain non-volatile memory cells. Control die 311 includes control circuitry 360, 310, 320. In some embodiments, the control die 311 is configured to connect to the memory structure 302 in the memory structure die 301. In some embodiments, the memory structure die 301 and the control die 311 are bonded together.

FIG. 5B shows an example of the peripheral circuitry, including control circuits, formed in a peripheral circuit or control die 311 coupled to memory structure 302 formed in memory structure die 301. Common components are labelled similarly to FIG. 5A. System control logic 360, row control circuitry 320, and column control circuitry 310 are located in control die 311. In some embodiments, all or a portion of the column control circuitry 310 and all or a portion of the row control circuitry 320 are located on the memory structure die 301. In some embodiments, some of the circuitry in the system control logic 360 is located on the on the memory structure die 301.

System control logic 360, row control circuitry 320, and column control circuitry 310 may be formed by a common process (e.g., CMOS process), so that adding elements and functionalities, such as ECC, more typically found on a memory controller 102 may require few or no additional process steps (i.e., the same process steps used to fabricate controller 102 may also be used to fabricate system control logic 360, row control circuitry 320, and column control circuitry 310). Thus, while moving such circuits from a die such as memory structure die 301 may reduce the number of steps needed to fabricate such a die, adding such circuits to a die such as control die 311 may not require any additional process steps. The control die 311 could also be referred to as a CMOS die, due to the use of CMOS technology to implement some or all of control circuitry 360, 310, 320.

FIG. 5B shows column control circuitry 310 including sense amplifier(s) 350 on the control die 311 coupled to memory structure 302 on the memory structure die 301 through electrical paths 306. For example, electrical paths 306 may provide electrical connection between column decoder 312, driver circuitry 314, and block select 316 and bit lines of memory structure 302. Electrical paths may extend from column control circuitry 310 in control die 311 through pads on control die 311 that are bonded to corresponding pads of the memory structure die 301, which are connected to bit lines of memory structure 302. Each bit line of memory structure 302 may have a corresponding electrical path in electrical paths 306, including a pair of bond pads, which connects to column control circuitry 310. Similarly, row control circuitry 320, including row decoder 322, array drivers 324, and block select 326 are coupled to memory structure 302 through electrical paths 308. Each of electrical path 308 may correspond to a word line, dummy word line, or select gate line. Additional electrical paths may also be provided between control die 311 and memory structure die 301.

For purposes of this document, the phrase "one or more control circuits" can include one or more of memory controller 102, system control logic 360, column control circuitry 310, row control circuitry 320, a micro-controller, a state machine, and/or other control circuitry, or other analogous circuits that are used to control non-volatile memory. The one or more control circuits can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term apparatus may include, but is not limited to, non-volatile storage system 100, memory controller 102, memory package 104, memory die 300, control die 311, integrated memory assembler 307, a micro-controller, a state machine, and/or other control circuitry, or other analogous circuits that are used to control non-volatile memory. The apparatus can include hardware only or a combination of hardware and software (including firmware).

Figure 5C:
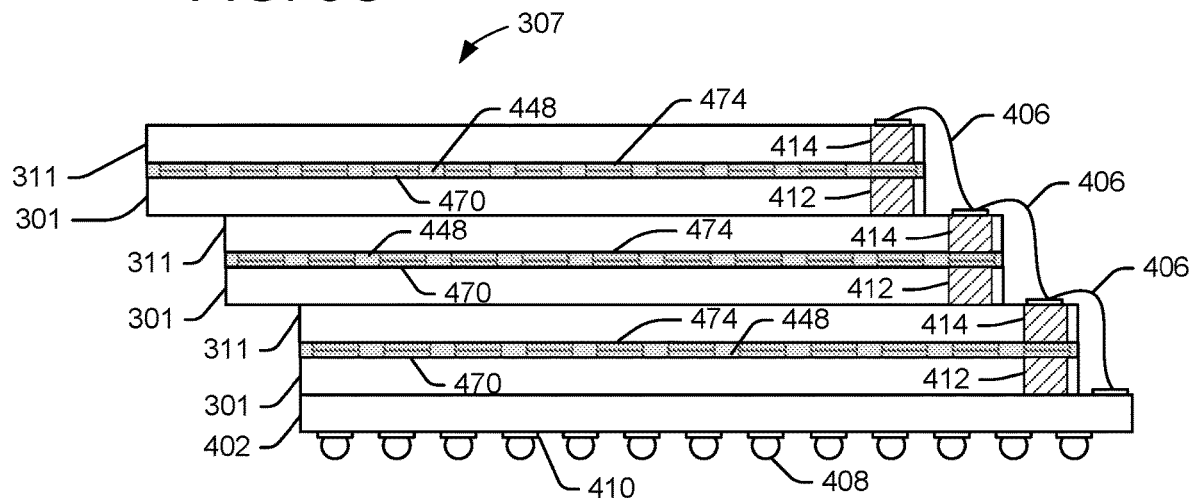
FIG. 5C depicts a side view of an embodiment of an integrated memory assembly stacked on a substrate.

In some embodiments, there is more than one control die 311 and more than one memory structure die 301 in an integrated memory assembly 307. In some embodiments, the integrated memory assembly 307 includes a stack of multiple control dies 311 and multiple memory structure dies 301. FIG. 5C depicts a side view of an embodiment of an integrated memory assembly 307 stacked on a substrate 402 (e.g., a stack comprising control dies 311 and memory structure dies 301). The integrated memory assembly 307 has three control dies 311 and three memory structure dies 301. In some embodiments, there are more than three memory structure dies 301 and more than three control dies 311.

Each control die 311 is affixed (e.g., bonded) to at least one of the memory structure dies 301. Some of the bond pads 470, 474, are depicted. There may be many more bond pads. A space between two dies 301, 311 that are bonded together is filled with a solid layer 448, which may be formed from epoxy or other resin or polymer. This solid layer 448 protects the electrical connections between the dies 301, 311, and further secures the dies together. Various materials may be used as solid layer 448, but in embodiments, it may be Hysol epoxy resin from Henkel Corp., having offices in California, USA.

The integrated memory assembly 307 may for example be stacked with a stepped offset, leaving the bond pads at each level uncovered and accessible from above. Wire bonds 406 connected to the bond pads connect the control die 311 to the substrate 402. A number of such wire bonds may be formed across the width of each control die 311 (i.e., into the page of FIG. 5C).

A memory structure die through silicon via (TSV) 412 may be used to route signals through a memory structure die 301. A control die through silicon via (TSV) 414 may be used to route signals through a control die 311. The TSVs 412, 414 may be formed before, during or after formation of the integrated circuits in the semiconductor dies 301, 311. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 408 may optionally be affixed to contact pads 410 on a lower surface of substrate 402. The solder balls 408 may be used to couple the integrated memory assembly 307 electrically and mechanically to a host device such as a printed circuit board. Solder balls 408 may be omitted where the integrated memory assembly 307 is to be used as an LGA package. The solder balls 408 may form a part of the interface between the integrated memory assembly 307 and the memory controller 102.

Figure 5D:
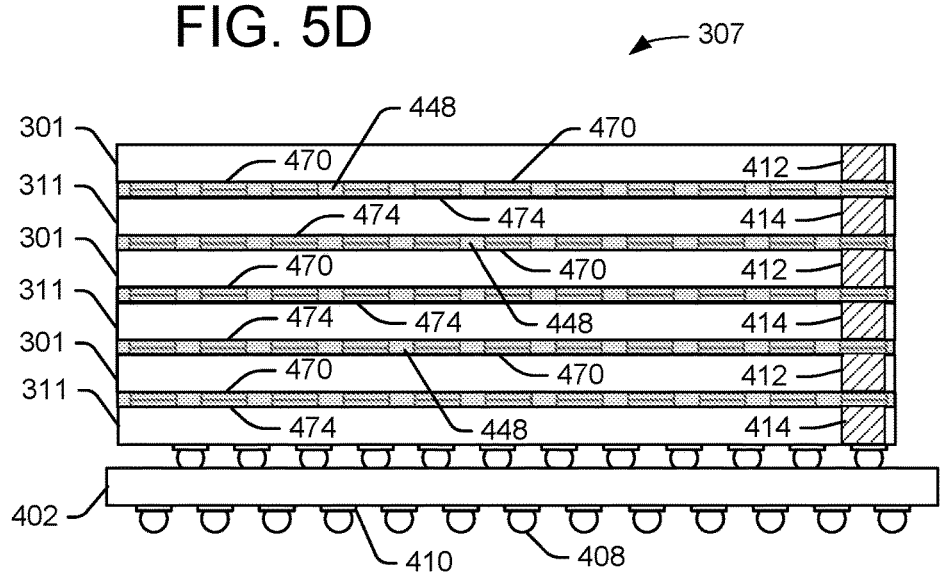
FIG. 5D depicts a side view of an embodiment of an integrated memory assembly stacked on a substrate.

FIG. 5D depicts a side view of an embodiment of an integrated memory assembly 307 stacked on a substrate 402. The integrated memory assembly 307 has three control dies 311 and three memory structure dies 301. In some embodiments, there are many more than three memory structure dies 301 and many more than three control dies 311. In this example, each control die 311 is bonded to at least one memory structure die 301. Optionally, a control die 311 may be bonded to two memory structure dies 301.

Some of the bond pads 470, 474 are depicted. There may be many more bond pads. A space between two dies 301, 311 that are bonded together is filled with a solid layer 448, which may be formed from epoxy or other resin or polymer. In contrast to the example in FIG. 5C, the integrated memory assembly 307 in FIG. 5D does not have a stepped offset. A memory structure die through silicon via (TSV) 412 may be used to route signals through a memory structure die 301. A control die through silicon via (TSV) 414 may be used to route signals through a control die 311.

Solder balls 408 may optionally be affixed to contact pads 410 on a lower surface of substrate 402. The solder balls 408 may be used to couple the integrated memory assembly 307 electrically and mechanically to a host device such as a printed circuit board. Solder balls 408 may be omitted where the integrated memory assembly 307 is to be used as an LGA package.

As has been briefly discussed above, the control die 311 and the memory structure die 301 may be bonded together. Bond pads on each die 301, 311 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 301, 311. Where no such film is initially provided, a space between the dies may be under filled with an epoxy or other resin or polymer. The under-fill material may be applied as a liquid which then hardens into a solid layer. This under-fill step protects the electrical connections between the dies 301, 311, and further secures the dies together. Various materials may be used as under-fill material, but in embodiments, it may be Hysol epoxy resin from Henkel Corp., having offices in California, USA.

Figure 6:
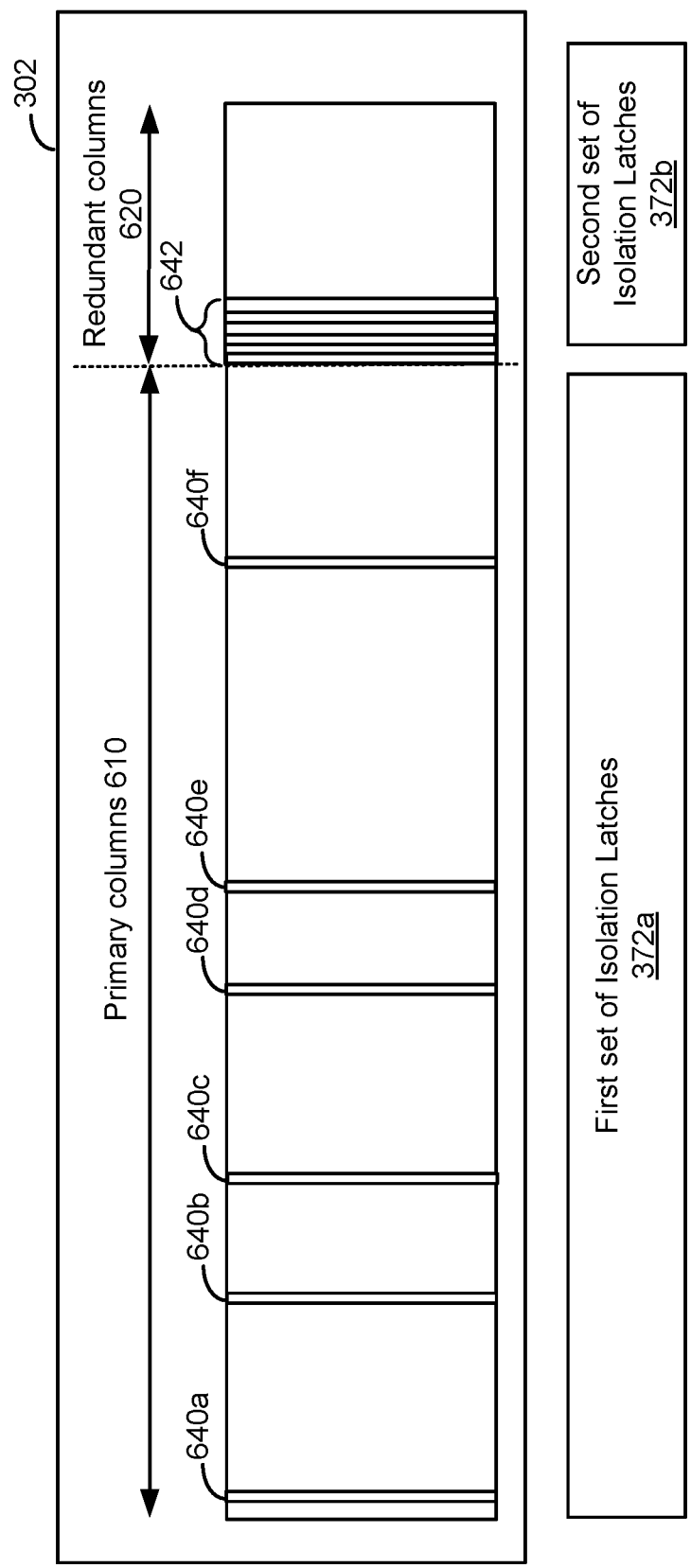
FIG. 6 depicts an example configuration of a memory structure arranged in an area having primary columns and an area having redundant columns.

FIG. 6 depicts an example configuration of a memory structure 302, where the memory structure is arranged in an area having primary columns 610 and an area having redundant columns 620. In one embodiment, each column has a width of one word, which could be 16 bits, 32 bits or some other size. A primary column is a column which does not replace a defective column but is intended to be used to store data as long as it is not defective. A redundant column (replacement column) may replace a defective primary column. However, some of the redundant columns may be unused, depending on the number of defective primary columns. The number of redundant columns is much less than the number of primary columns, e.g., <1% of the number of primary columns.

The defective primary columns may be detected when the memory structure 302 is manufactured, prior to using the memory structure 302 in the field. FIG. 6 shows six example defective primary columns 640a-640f. There are a corresponding six redundant columns 642 that are in use as replacement columns. The column redundancy table 370 contains a mapping of the address of each respective defective primary column 640 to the corresponding redundant column 642 that replaces the defective primary column 640 for memory operations. The rest of the redundant columns 620 are not in use. During a program operation, the data to be programmed may be diverted from a defective primary column 640 to the replacement redundant column 642. During a read operation, the data is read from the replacement redundant column 642 instead of the defective primary column 640.

In one embodiment, there is an isolation latch 372 for each column in order to store the status of that column. Each latch in the first set of isolation latches 372a stores the status of one of the primary columns 610. Each latch in the second set of isolation latches 372b stores the status of one of the redundant columns 620.

In one embodiment, the memory structure 302 has an area with primary rows and an area having redundant rows. In one embodiment, each row has a width of one word, which could be 16 bits, 32 bits or some other size. However, a row could have a size that is not equal to one word (e.g., the row could be larger than a word such as a block). In one embodiment, there is an isolation latch for each row in order to store the status of that row. In an embodiment, each latch in one set of isolation latches stores the status of one of the primary rows. In an embodiment, these latches for the primary rows are reset and set in a similar manner as the first set of isolation latches 372a for the primary columns. In an embodiment, each latch in another set of isolation latches stores the status of one of the redundant rows. In an embodiment, these latches for the redundant rows are reset and set in a similar manner as the second set of isolation latches 372b for the primary columns.

Figure 7A:
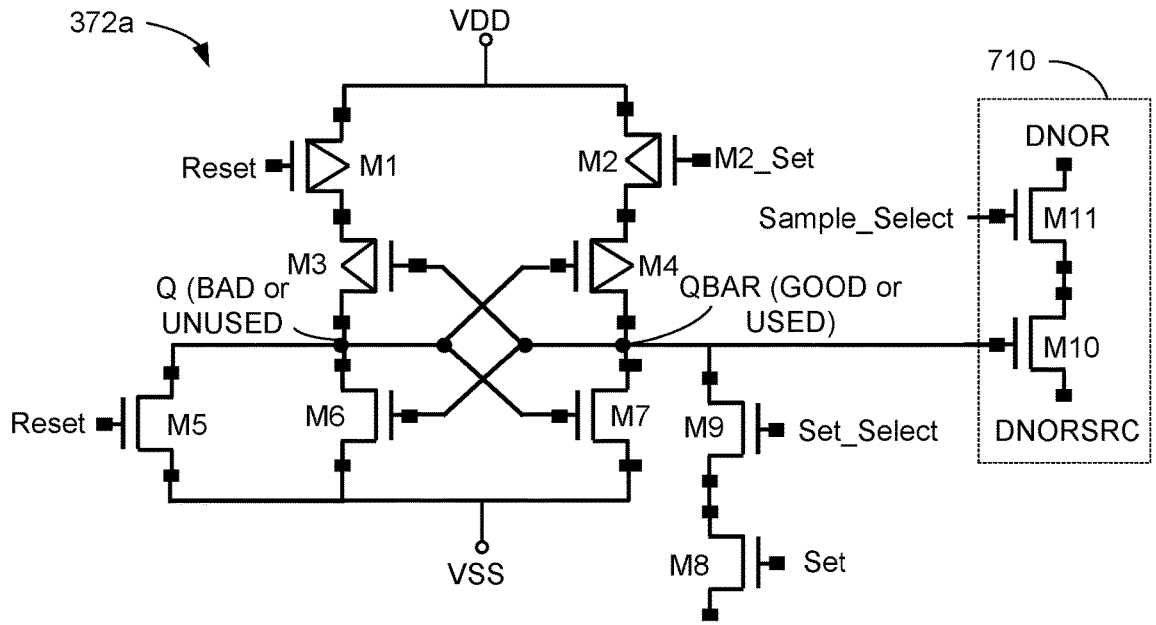
FIG. 7A depicts one embodiment of an isolation latch that is used for status of a primary column, along with sensing transistors to read the status.

FIG. 7A depicts one embodiment of an isolation latch 372a that is used for status of a primary column, along with sensing transistors to read the status. Transistors M1-M9 form an embodiment of the isolation latch 372a. Transistors M10-M11 are part of a readout circuit 710 to sense an output of the isolation latch 372a.

The isolation latch 372a has an output that can be set to two states. The output is at two different nodes of the latch, with the voltage at each node being the complement of the other. The output nodes are labeled Q and QBAR. Using terminology commonly used for Set/Reset latches, the isolation latch 372 has a Set Input at the gate of transistor M8, a Reset Input at the gates of transistors M1 and M5, a QBAR output at the node between transistors M4 and M7 (which is also at the gates of transistors M3 and M6), and a Q output at the node between transistors M3 and M6 (which is also at the gates of transistors M4 and M7). Setting the isolation latch 372a results in Q being 1 and QBAR being 0. In contrast, resetting the isolation latch results in Q being 0 and QBAR being 1. In an embodiment, a value of 1 at QBAR indicates a status (or state) of GOOD or USED for the corresponding primary column. In an embodiment, a value of 1 at Q indicates a status of BAD or UNUSED for the corresponding primary column.

In an embodiment, resetting the isolation latch 372a includes applying a high voltage to the gates of M1 and M5 while applying a low voltage to the gates of transistors M2 and M8. The voltage at ISOXBUS may be VSS (e.g., 0V). Resetting the isolation latch 372a results in a high voltage (referred to herein as 1) at QBAR and a low voltage (referred to herein as 0) at Q. The high voltage to the gates of M1 and M5 may be a voltage pulse, with the isolation latch 372a holding the QBAR node at 1 and the Q node at 0 after the voltage pulse.

In an embodiment, setting the isolation latch 372a includes applying a low voltage to the gates of M1 and M5 while applying a high voltage to the gates of transistors M2, M8, and M9. Setting the isolation latch 372a results in a high voltage (1) at the Q node and a low voltage (0) at the QBAR node. The high voltage to the gates of one or more of M2, M8, and M9 may be a voltage pulse, with the isolation latch 372a holding the Q node at 1 and the QBAR node at 0 after the voltage pulse.

In an embodiment, transistor M9 may be used to individually select one isolation latch 372a. This may be used to set one specific isolation latch. In one embodiment, the value of the Sel_select signal to the gate of M9 is based on the address of the primary column that is associated with the isolation latch 372a. Thus, the isolation latch 372a may be selected based on the address of the primary column that is associated with the isolation latch 372a.

Transistors M10 and M11 are part of a readout circuit 710 used to read the state of the isolation latch 372a. The gate of M10 is connected to the QBAR output to read the voltage at the QBAR node. A Sample_Select signal may be applied to the gate of transistor M11 to select a specific isolation latch 372a to read. In one embodiment, the readout circuit 710 is used to read the status of the latch during a program verify operation. The program verify operation counts what may be referred to as "fail bits", which refer to memory cells that have not yet reached their intended programming state. In one embodiment, if the isolation latch 372a indicates that the corresponding primary column is bad (or unused), then any fail bit status for that primary column is ignored.

In an embodiment, the voltage DNORSRC is set based on whether the associated memory cell passed a program verify test that indicated that the memory cell is programmed to its target state. In an embodiment, the source of M10 (DNORSRC) is set to VDD if the memory cell passed program verify and VSS if the memory cell did not pass program verify (referred to as a "fail bit"). In an embodiment, when reading the latch 372a, initially the drain of M11 (DNOR) is precharged to VDD. The drain of M11 will go to VSS if the memory cell failed program verify (a fail bit) and the column is being used. In all other cases, the drain of M11 will remain at VDD. The other cases include the case in which the column is being used and the cell passes program verify, as well as if the column is not being used (whether or not the memory cell passes program verify). Therefore, the fail bit status at the source of M10 is ignored if the column is not used (bad). Hence, the only case in which the fail bit will be counted is when the column is in use (good) and the memory cell failed program verify.

Figure 7B:
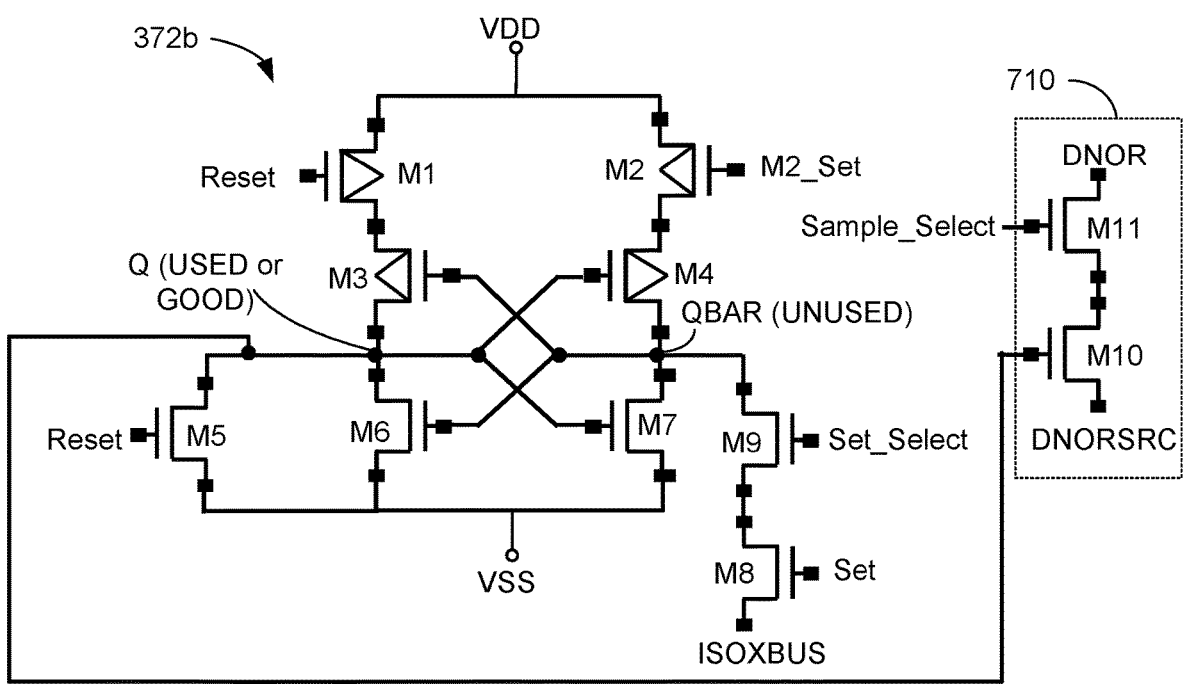
FIG. 7B depicts one embodiment of an isolation latch that is used for status of a redundant column, along with sensing transistors to read the status.

FIG. 7B depicts one embodiment of an isolation latch 372b that is used for status of a redundant column, along with sensing transistors to read the status. The isolation latch 372b is very similar to the one in FIG. 7B and will not be discussed in detail. The similarity of the two latches 372a, 372b simplifies the fabrication process, as well as controlling the latches.

Transistors M1-M9 form an embodiment of the isolation latch 372b. Transistors M10-M11 are used to sense an output of the isolation latch 372b. In an embodiment, a value of 1 at the QBAR node indicates a status of UNUSED for the corresponding redundant column. In an embodiment, a value of 1 at the Q node indicates a status of USED or GOOD for the corresponding redundant column. Thus, the status at the Q and QBAR nodes may be considered to be opposite to the isolation latch 372a in FIG. 7A. For example, a value of 1 at the QBAR node in the isolation latch 372a in FIG. 7A indicates a status of USED for the corresponding primary column; however, a value of 1 at the QBAR node in the isolation latch 372b in FIG. 7B indicates a status of UNUSED for the corresponding redundant column. Recall that in step 82 of FIG. 3, all of the isolation latches are simultaneously reset to their respective initial states. In an embodiment, this reset applies the same control signal (e.g., Reset to M1 and M5) to all isolation latches, which simplifies operation.

Another difference between the two isolation latches 372a, 372b is that in FIG. 7B the gate of transistor M10 is connected to the Q output to read the voltage at that node, as opposed to the voltage at the QBAR output as was the case in FIG. 7A. As noted above, transistors M10 and M11 are part of a readout circuit 710 used to read the state of the isolation latch 372b. In one embodiment, the readout circuit 710 is used to read the status of the latch 372b during a program verify operation. In one embodiment, if the isolation latch 372b indicates that the corresponding redundant column is unused, then any fail bit status for that redundant column is ignored. On the other hand, if the isolation latch 372b indicates that the corresponding redundant column is used as a replacement for a defective primary column, then any fail bit status for that redundant column is considered during program verify. The readout circuit 710 in FIG. 7B may operate in a similar manner as the readout circuit 710 in FIG. 7A.

In one embodiment, the latch 372a of FIG. 7A and the latch 372b of FIG. 7B can be read by way of a bus (ISOXBUS) connected to transistor M8. This will read the status at the QBAR node. In one embodiment, when reading the status of latch 372b of FIG. 7B at the QBAR node, the polarity of the signal that is read is inverted. This accounts for a QBAR value of 1 in latch 372b of FIG. 7B being unused compared to a QBAR value of 1 in latch 372a of FIG. 7A being used (or good). Therefore, after inverting the polarity of the status read from the QBAR node in the latch 372b of FIG. 7B, the (inverted) status will have the same meaning as for the latch 372a of FIG. 7A. This slight difference in reading the status allows for a common circuit design with respect to the connections of M8 and M9 in the isolation latches 372a, 372b, which simplifies the fabrication of the latches 372. Also, the logic that interprets the status read from the respective QBAR nodes can be the same, given the inverting of the polarity of the status read from the QBAR node in the latch 372b of FIG. 7B, which simplifies the overall design of the memory system.

FIG. 8 is a flowchart of one embodiment of a process 800 of resetting isolation latches. The process 800 provides further details of one embodiment of a reset phase of a column redundancy load that occurs in a power on read. Process 800 is used to reset all of the isolation latches to an initial state. The process provides further details of one embodiment of step 82 in FIG. 3.

Step 802 includes holding the set inputs of the isolation latches to a low voltage. With reference to FIG. 7A and 7B, the Set signal to the gates of M2 and M8 may be kept low. The Set signal may be kept low throughout process 800. The voltage at ISOXBUS can be set to VSS (e.g., 0V).

Step 804 includes issuing a common reset pulse to the reset input of all isolation latches. With reference to FIG. 7A, the Reset Signal at the gates of M1 and M5 is pulsed high to reset each of the isolation latches 372a for the primary columns. With reference to FIG. 7B, the Reset Signal at the gates of M1 and M5 is pulsed high to reset each of the isolation latches 372b for the redundant columns. As a result all of the isolation latches 372a, 372b are simultaneously reset to an initial (or default) state. After process 800, all of the isolation latches 372 may be in a hold condition in which the output state remains fixed.

In an embodiment, the initial state for all isolation latches 372 will be for QBAR to be 1 and Q to be 0. In an embodiment, the initial state for the isolation latches 372a for the primary columns are reset to an initial state that indicates that the primary column is good (or used). In an embodiment, the initial state for the isolation latches 372b for the redundant columns are set to an initial state that indicates that the redundant column is not used to replace any of the primary columns.

FIG. 9 is a flowchart of one embodiment of a process 900 of setting isolation latches. The process 900 provides further details of one embodiment of a set phase of a column redundancy load that occurs in a power on read. Prior to process 900 all of the isolation latches are reset to an initial state. In one embodiment, process 900 follows process 800. Process 900 is used to set some of the isolation latches from the initial state to their respective final states that they will hold during memory operations. Other isolation latches will remain in the state to which they were reset (in process 800 of FIG. 8). The process 900 provides further details of one embodiment of steps 84-88 in FIG. 3.

Step 902 includes accessing an address of a defective primary column and an address of a redundant column to which the defective primary column is mapped. In an embodiment, the column redundancy table 370 is accessed to determine the addresses. Note that the column redundancy table 370 may be loaded from non-volatile memory cells in memory structure 302 prior to process 900, wherein the column redundancy table 370 may be stored in a register or the like outside of the memory structure 302 (e.g., in a peripheral circuit of memory die 300 (see FIG. 5A) or on control die 311 (see FIG. 5B)).

Step 904 includes holding the reset inputs of the isolation latches to a low voltage. With reference to FIG. 7A and 7B, the Reset signal to the gates of M1 and M5 may be kept low. That is, the Reset signal may be kept at the level used to hold the latch output. The Reset signal may be kept low throughout process 900.

Step 906 includes selecting an isolation latch 372a for the defective primary column. In an embodiment, the address of a defective primary column is used to select the isolation latch. With reference to FIG. 7A, the Set_Select signal to the gate of M9 may be set to high to select the isolation latch 372a.

Step 908 includes selecting an isolation latch 372b for the redundant column to which the defective primary column is mapped. In an embodiment, the address of the redundant column in step 902 is used to select the isolation latch. With reference to FIG. 7B, the Set_Select signal to the gate of M9 may be set to high to select the isolation latch 372b.

Step 910 includes issuing a set voltage pulse to the selected isolation latches. With reference to FIG. 7A, the Set Signal at the gate of M8 is pulsed high to set isolation latch 372a. With reference to FIG. 7B, the Set Signal at the gate of M8 is pulsed high and the signal M2_set at the gate of M2 may be pulsed high to set isolation latch 372a. As a result, the isolation latch 372a for the defective primary column is set in parallel with setting the isolation latch 372b for the corresponding redundant column. Therefore, setting the isolation latch 372b for the redundant column does not add any extra time to the time that is used to set the isolation latch 372a for the defective primary column.

Step 912 includes de-selecting the isolation latches. In an embodiment, the Set_Select signal to the gate of M9 is returned to low to de-select the isolation latches.

Step 914 includes a determination of whether there is another defective primary column. This determination may be made by consulting the column redundancy table 370. Steps 902-912 are then performed for the next defective primary column.

Figure 10A:
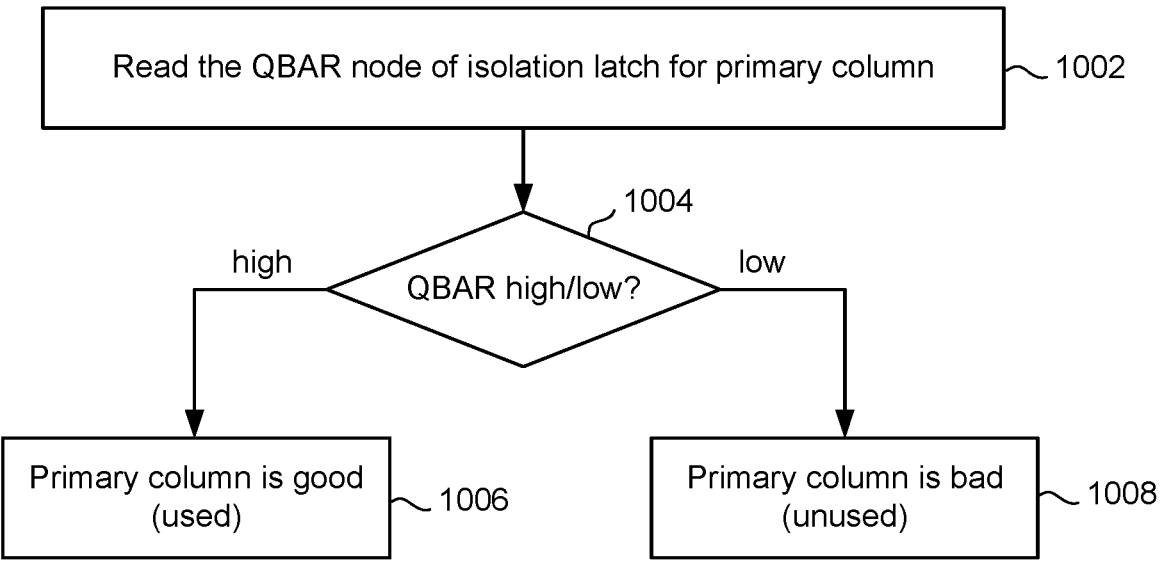
FIG. 10A is a flowchart of one embodiment of reading status of an isolation latch for a primary column.

FIG. 10A is a flowchart of one embodiment of reading status of an isolation latch 372a for a primary column. The status may be read as part of a memory operation (e.g., read, program). In an embodiment, the process is used to read a fail bit status during a program verify. In that case, the voltage at the source of M10 may be set based on the fail bit status of a memory cell in the corresponding column as discussed in connection with FIG. 7A. Also, the voltage at the drain of M11 may be precharged to VDD. Step 1002 includes reading a QBAR node of an isolation latch 372a for a primary column. In an embodiment, the readout circuit 710 reads the QBAR node. Step 1004 includes a determination of whether QBAR is high or low. In an embodiment, step 1004 includes applying the voltage at QBAR to the gate of M10 in the readout circuit 710. As indicated by step 1006, if QBAR is high this indicates that the primary column is good (used for a memory operation). As indicated by step 1008 if QBAR is low this indicates that the primary column is bad (not used for a memory operation). In an embodiment of a program verify operation, the "fail bits" are counted to determine whether all but a certain number of memory cells have been programmed to their target state. For example, programming may complete if, for example, 16, 32 or some other number or memory cells have still not reached their target state. This counting process will exclude any unused or defective columns. Hence, primary columns identified as bad in step 1008 will not be counted as a fail bit. As discussed above in connection with FIG. 7A, the voltage at the drain of M11 may be read to determine whether to count a fail bit.

Figure 10B:
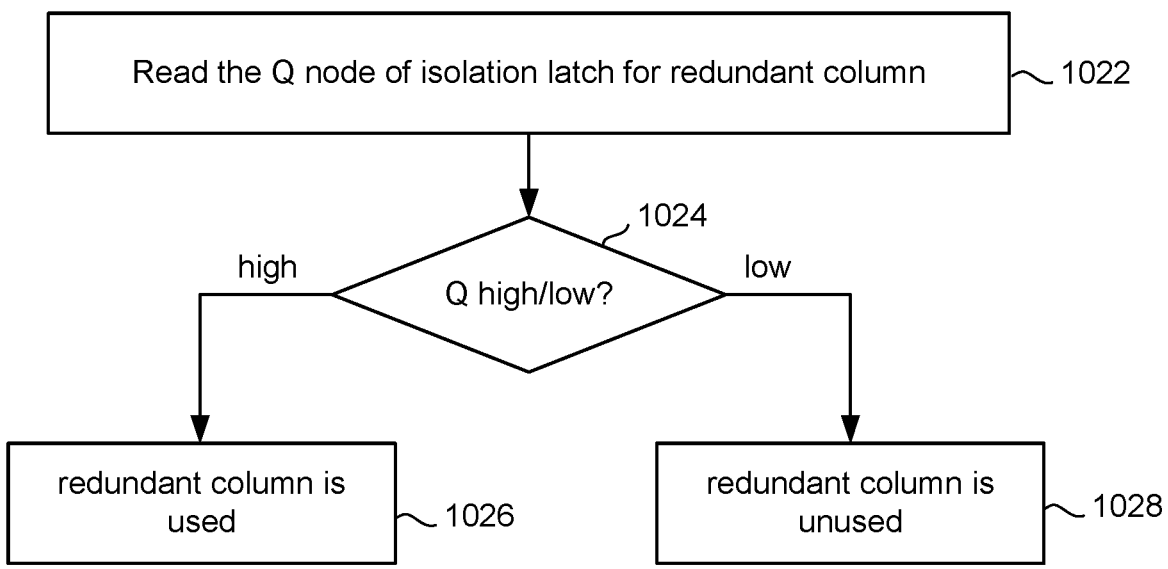
FIG. 10B is a flowchart of one embodiment of reading status of an isolation latch for a redundant column.

FIG. 10B is a flowchart of one embodiment of reading status of an isolation latch 372 for a redundant column. The status may be read as part of a memory operation (e.g., read, program). In an embodiment, the process is used to read a fail bit status during a program verify. In that case, the voltage at the source of M10 may be set based on the fail bit status of a memory cell in the corresponding column. Also, the voltage at the drain of M11 may be precharged to VDD. Step 1022 includes reading a Q node of an isolation latch for a primary column. In an embodiment, the readout circuit 710 reads the Q node. Step 1024 includes a determination of whether the Q node is high or low. As indicated by step 1026, if the Q node is high this indicates that the redundant column is used for a memory operation. As indicated by step 1028 if Q is low this indicates that the redundant column is not used for the memory operation. In an embodiment of a program verify operation, the counting of fail bits will exclude any unused redundant columns. Hence, redundant columns identified as unused in step 1028 will not be counted as a fail bit. The voltage at the drain of M11 may be read to determine whether to count a fail bit.

Figure 10C:
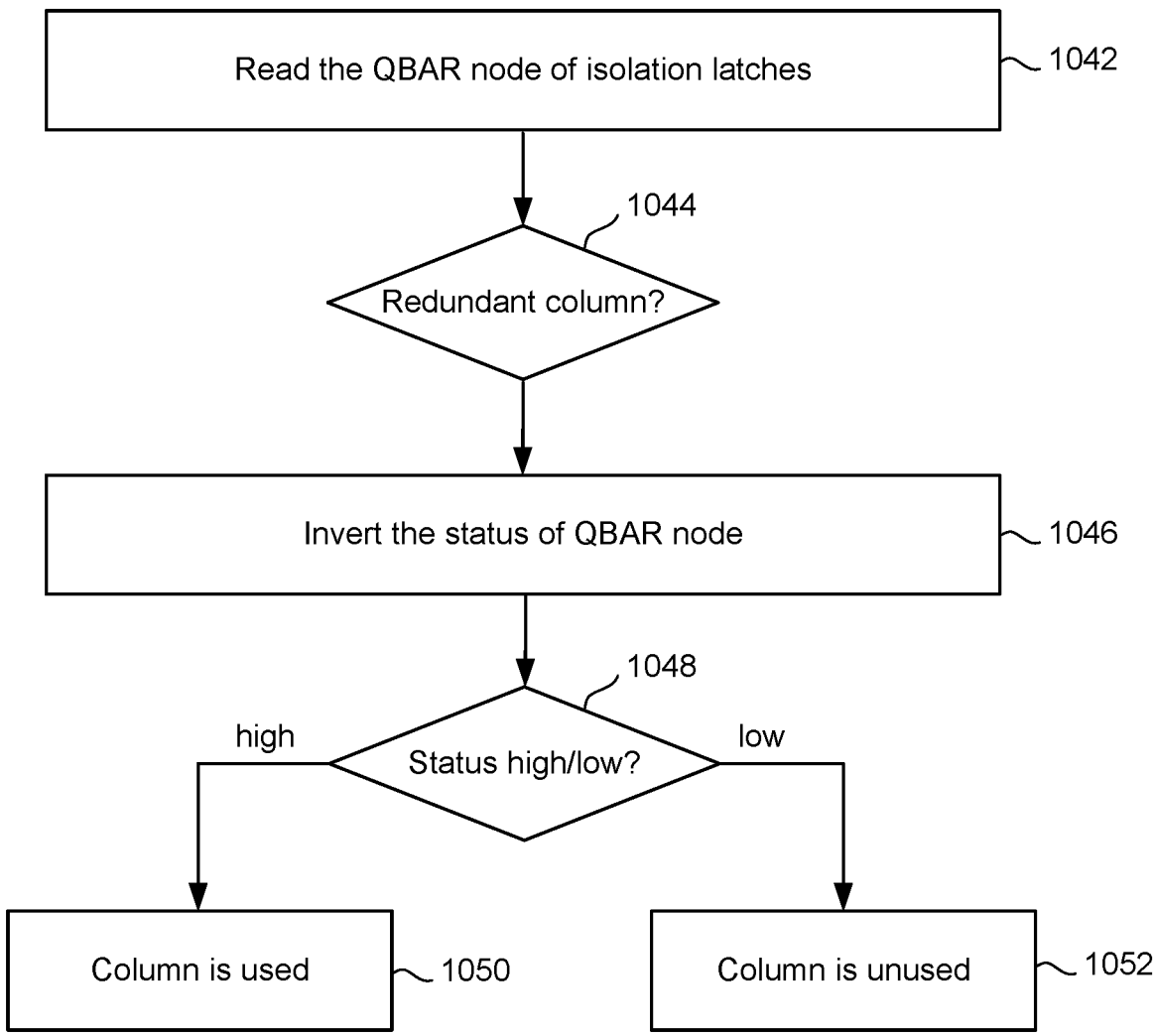
FIG. 10C is a flowchart of one embodiment of reading status of an isolation latch by way of an ISOXBUS.

In one embodiment, the isolation latches are read by way of the ISOXBUS (see FIGS. 7A, 7B). FIG. 10C is a flowchart of one embodiment of reading status of an isolation latch 372 by way of the ISOXBUS. This process is used to read the isolation latches of both the primary columns 610 and the redundant columns 620. Step 1042 includes reading a QBAR node of each isolation latch 372. The QBAR node is read by way of the ISOXBUS. Step 1044 is a determination of whether the isolation latch is for a redundant column. If so, then the status of the QBAR node is inverted in step 1046. That is, a high signal (e.g., 1) is inverted to a low signal (e.g., 0) or alternatively low signal (e.g., 0) is inverted to a high signal (e.g., 1). Step 1048 includes a determination of whether the status is high or low. As indicated by step 1050, if the status is high this indicates that the column is used for a memory operation. As indicated by step 1052 if the status is low this indicates that the column is not used for memory operations. In some embodiments, the same logic is used in steps 1048-1052 for all isolation latches 372. Thus, inverting the status for latches 372b in step 1046 allows the same logic to be used in steps 1048-1052, which simplifies the design of the memory system.

Although numerous examples have been provided in which the primary regions are primary columns and the redundant regions are redundant columns, in some embodiments the primary regions are primary rows and the redundant regions are redundant rows.

In view of the foregoing, it can be seen that one embodiment includes an apparatus comprising one or more control circuits configured to connect to a memory structure comprising non-volatile memory cells. The memory structure is organized in a plurality of primary regions and a plurality of redundant regions. The one or more control circuits are configured to place a plurality of first isolation latches to a first output state that indicates that a corresponding primary region is used for memory operations. The one or more control circuits are configured to place a plurality of second isolation latches to a second output state that indicates that a corresponding redundant region is not used as a replacement for any primary region. The one or more control circuits are configured to access a mapping from each respective defective primary region to a respective redundant region. The one or more control circuits are configured to, after placing each first isolation latch to the first output state, place each first isolation latch for which the corresponding primary region is defective from the first output state to a third output state that indicates that the corresponding primary region is not used for memory operations. The one or more control circuits are configured to, after placing each second isolation latch to the second output state, place each second isolation latch for which the corresponding redundant region is mapped to a defective primary region from the second output state to a fourth output state that indicates that the corresponding redundant region is used as a replacement for a defective primary region.

In a second embodiment, in furtherance of the first embodiment, the one or more control circuits are further configured to place each respective first isolation latch for which a corresponding primary region is defective from the first output state to the third output state in parallel with placing a corresponding second isolation latch from the second output state to the fourth output state.

In a third embodiment, in furtherance of the first or second embodiments, the one or more control circuits are further configured to simultaneously place each first isolation latch to the first output state and place each second isolation latch to the second output state during a first phase of a power on read that reads defective region information from the memory structure.

In a fourth embodiment, in furtherance of any of the first to third embodiments, the one or more control circuits are further configured to: access a mapping of a first address of a defective primary region to a second address of a redundant region that serves as a replacement for the defective primary region having the first output state; select a first isolation latch based on the first address of the defective primary region; select a second isolation latch based on the second address of the redundant region; and place the selected first isolation latch from the first output state to the third output state in parallel with placing the selected second isolation latch from the second output state to the fourth output state.

In a fifth embodiment, in furtherance of any of the first to fourth embodiments, the one or more control circuits are further configured to apply a common signal to each first isolation latch and each second isolation latch to place each first isolation latch to the first output state in parallel with placing each second isolation latch to the second output state during a first phase of a power on read that reads defective region information from the memory structure.

In a sixth embodiment, in furtherance of any of the first to fifth embodiments, the plurality of first isolation latches and the plurality of second isolation latches each comprise a set/reset latch, each set/reset latch comprising a set input, a reset input, a Q output, a QBAR output, and a set select input. The one or more control circuits are configured to apply a common reset signal to the reset inputs of the respective first isolation latches and the reset inputs of the respective second isolation latches to simultaneously place the first isolation latches to the first output state and place the second isolation latches to the second output state during a first phase of a power on read that reads defective region information from the memory structure and establishes status of the isolation latches.

In a seventh embodiment, in furtherance of the sixth embodiment, the one or more control circuits are further configured to: apply a first select signal to the set select input of a first isolation latch to select the first isolation latch while applying a second select signal to the set select input of a second isolation latch to select the second isolation latch during a second phase of the power on read that follows the first phase; and apply a first set signal to the set input the selected first isolation latch to set the selected first isolation latch from the first output state to the third output state while applying a second set signal to the set input of the selected second isolation latch to set the selected second isolation latch from the second output state to the fourth output state during the second phase of the power on read.

In an eighth embodiment, in furtherance of the seventh embodiment, the one or more control circuits are further configured to: access a mapping from a first address of a defective primary region to a second address of a redundant region that is to replace the defective primary region; select the selected first isolation latch based on the first address; and select the selected second isolation latch based on the second address.

In a ninth embodiment, in furtherance of any of the first to eighth embodiments, the one or more control circuits are further configured to perform memory operations after placing each first isolation latch for which the corresponding primary region is defective from the first output state to the third output state and after placing each second isolation latch for which the corresponding redundant region is mapped to the defective primary region from the second output state to the fourth output state. During the memory operations the one or more control circuits: read the plurality of first isolation latches to determine whether the corresponding primary region is to be used for the memory operations; and read the plurality of second isolation latches to determine whether the corresponding redundant region is to be used for the memory operations.

In a tenth embodiment, in furtherance of any of the first to ninth embodiments, the memory structure comprises the mapping from each respective defective primary region to the respective redundant region. The defective primary regions are each a primary column. The redundant regions are each a redundant column. The one or more control circuits are configured to load the mapping into temporary storage.

One embodiment includes a method of operating non-volatile storage. The method comprises loading column redundancy information from a memory structure of a memory die in response to the memory die being powered on, wherein the column redundancy information contains, for each defective primary column in the memory structure, a mapping between the defective primary column and a redundancy column in the memory structure. The method comprises simultaneously resetting a plurality of first isolation latches to a first output state that indicates that a corresponding primary column in a memory structure of the memory die is operational while resetting a plurality of second isolation latches to a second output state that indicates that a corresponding redundant column in the memory structure is not used as a replacement for any primary column. The method comprises, for each defective primary column listed in the column redundancy information:

accessing a mapping to one of the redundant columns; and setting a first isolation latch that corresponds to the defective primary column from the first output state to a third output state that indicates that the corresponding primary column is defective while simultaneously setting a second isolation latch that corresponds to the redundant column that maps to the respective defective primary column from the second output state to a fourth output state that indicates that the corresponding redundant column is a replacement for the defective primary column.

One embodiment includes a non-volatile storage system, comprising a memory structure comprising non-volatile memory cells. The memory structure is organized in a plurality of primary columns and a plurality of redundant columns. The non-volatile storage system has a plurality of first isolation latches with first isolation latch corresponding to one of the plurality of primary columns. Each first isolation latch has a first output state and a second output state. The non-volatile storage system has a plurality of second isolation latches, with each second isolation latch corresponding to one of the plurality of redundant columns. Each second isolation latch has a third output state and a fourth output state. The non-volatile storage system has one or more control circuits in communication with the memory structure, the plurality of first isolation latches, and the plurality of second isolation latches. The one or more control circuits are configured to: during a first phase of a column redundancy load, simultaneously reset all of the first isolation latches to the first output state and reset all of the second isolation latches to the third output state. The one or more control circuits are configured to: access a mapping between each respective defective primary column and one of the redundant columns. The one or more control circuits are configured to, during a second phase of the column redundancy load that follows the first phase, for each respective defective primary column: set a first isolation latch that corresponds to the defective primary column from the first output state to the second output state while simultaneously setting a second isolation latch that corresponds to a redundant column that maps to the respective defective primary column from the third output state to the fourth output state. The one or more control circuits are configured to, after the column redundancy load, for each first isolation latch: determine that the corresponding primary column is operational if the first isolation latch is in the first output state and determine that the corresponding primary column is defective if the first isolation latch is in the second output state. The one or more control circuits are configured to, after the column redundancy load, for each second isolation latch: determine that the corresponding redundant column is a replacement for a defective primary column if the second isolation latch is in the fourth output state and determine that the corresponding redundant column is not used as a replacement for any primary column if the second isolation latch is in the third output state.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
   one or more control circuits configured to connect to a memory structure comprising non-volatile memory cells, the memory structure organized in a plurality of primary regions and a plurality of redundant regions;
   wherein the one or more control circuits are configured to:
      place a plurality of first isolation latches to a first output state that indicates that a corresponding primary region is used for memory operations;
      place a plurality of second isolation latches to a second output state that indicates that a corresponding redundant region is not used as a replacement for any primary region;
      access a mapping from each respective defective primary region to a respective redundant region;
      after placing each first isolation latch to the first output state, place each first isolation latch for which the corresponding primary region is defective from the first output state to a third output state that indicates that the corresponding primary region is not used for memory operations; and
      after placing each second isolation latch to the second output state, place each second isolation latch for which the corresponding redundant region is mapped to a defective primary region from the second output state to a fourth output state that indicates that the corresponding redundant region is used as a replacement for a defective primary region.

2. The apparatus of claim 1, wherein the one or more control circuits are further configured to:
   place each respective first isolation latch for which a corresponding primary region is defective from the first output state to the third output state in parallel with placing a corresponding second isolation latch from the second output state to the fourth output state.

3. The apparatus of claim 1, wherein the one or more control circuits are further configured to:
   simultaneously place each first isolation latch to the first output state and place each second isolation latch to the second output state during a first phase of a power on read that reads defective region information from the memory structure.

4. The apparatus of claim 1, wherein the one or more control circuits are further configured to:
  access a mapping of a first address of a defective primary region to a second address of a redundant region that serves as a replacement for the defective primary region having the first output state;
  select a first isolation latch based on the first address of the defective primary region;
  select a second isolation latch based on the second address of the redundant region; and
  place the selected first isolation latch from the first output state to the third output state in parallel with placing the selected second isolation latch from the second output state to the fourth output state.

5. The apparatus of claim 1, wherein the one or more control circuits are further configured to:
  apply a common signal to each first isolation latch and each second isolation latch to place each first isolation latch to the first output state in parallel with placing each second isolation latch to the second output state during a first phase of a power on read that reads defective region information from the memory structure.

6. The apparatus of claim 1, wherein:
  the plurality of first isolation latches and the plurality of second isolation latches each comprise a set/reset latch, each set/reset latch comprising a set input, a reset input, a Q output, a QBAR output, and a set select input; and
  the one or more control circuits are configured to apply a common reset signal to the reset inputs of the respective first isolation latches and the reset inputs of the respective second isolation latches to simultaneously place the first isolation latches to the first output state and place the second isolation latches to the second output state during a first phase of a power on read that reads defective region information from the memory structure and establishes status of the isolation latches.

7. The apparatus of claim 6, wherein the one or more control circuits are further configured to:
  apply a first select signal to the set select input of a first isolation latch to select the first isolation latch while applying a second select signal to the set select input of a second isolation latch to select the second isolation latch during a second phase of the power on read that follows the first phase; and
  apply a first set signal to the set input of the selected first isolation latch to set the selected first isolation latch from the first output state to the third output state while applying a second set signal to the set input of the selected second isolation latch to set the selected second isolation latch from the second output state to the fourth output state during the second phase of the power on read.

8. The apparatus of claim 7, wherein the one or more control circuits are further configured to:
  access a mapping from a first address of a defective primary region to a second address of a redundant region that is to replace the defective primary region;
  select the selected first isolation latch based on the first address; and
  select the selected second isolation latch based on the second address.

9. The apparatus of claim 1, wherein the one or more control circuits are further configured to perform memory operations after placing each first isolation latch for which the corresponding primary region is defective from the first output state to the third output state and after placing each second isolation latch for which the corresponding redundant region is mapped to the defective primary region from the second output state to the fourth output state, wherein during the memory operations the one or more control circuits:
  read the plurality of first isolation latches to determine whether the corresponding primary region is to be used for the memory operations; and
  read the plurality of second isolation latches to determine whether the corresponding redundant region is to be used for the memory operations.

10. The apparatus of claim 1, wherein:
  the memory structure comprises the mapping from each respective defective primary region to the respective redundant region, wherein the defective primary regions are each a primary column, wherein the redundant regions are each a redundant column; and
  the one or more control circuits are configured to load the mapping into temporary storage.

11. A method of operating non-volatile storage, the method comprising:
  loading column redundancy information from a memory structure of a memory die in response to the memory die being powered on, wherein the column redundancy information contains, for each defective primary column in the memory structure, a mapping between the defective primary column and a redundancy column in the memory structure;
  simultaneously resetting a plurality of first isolation latches to a first output state that indicates that a corresponding primary column in a memory structure of the memory die is operational while resetting a plurality of second isolation latches to a second output state that indicates that a corresponding redundant column in the memory structure is not used as a replacement for any primary column;
  for each defective primary column listed in the column redundancy information:
    accessing a mapping to one of the redundant columns; and
    setting a first isolation latch that corresponds to the defective primary column from the first output state to a third output state that indicates that the corresponding primary column is defective while simultaneously setting a second isolation latch that corresponds to the redundant column that maps to the respective defective primary column from the second output state to a fourth output state that indicates that the corresponding redundant column is a replacement for the defective primary column.

12. The method of claim 11, further comprising performing memory operations in the memory structure after setting the first isolation latches that correspond to the defective primary columns to the third output state and setting the second isolation latches that correspond to the redundant columns that map to the respective defective primary columns to the fourth output state, including:
  reading the plurality of first isolation latches to determine whether each respective primary column is to be used for the memory operations; and
  reading the plurality of second isolation latches to determine whether each respective redundant column is to be used as a replacement for a defective primary column for the memory operations.

13. The method of claim 12, wherein:
  determining whether each respective primary column is to be used for the memory operations comprises determining to use a particular primary column if the first isolation latch for the particular primary column is in the first state; and determining whether each respective redundant column is to be used as a replacement for a defective primary column comprises determining to use a particular redundant column if the second isolation latch for the particular redundant column was set to the fourth state.

14. The method of claim 11, wherein setting the first isolation latch that corresponds to a particular defective primary column from the first output state to the third output state while simultaneously setting the second isolation latch that corresponds to the redundant column that maps to the particular defective primary column from the second output state to the fourth output state comprises:

accessing a mapping from a first address of the particular defective primary column to a second address of the redundant column that is to replace the particular defective primary column;

selecting a first isolation latch based on the first address;

selecting a second isolation latch based on the second address; and issuing a set pulse to both the selected first isolation latch and to the selected second isolation latch.

15. A non-volatile storage system comprising:

a memory structure comprising non-volatile memory cells, the memory structure organized in a plurality of primary columns and a plurality of redundant columns;

a plurality of first isolation latches, wherein each first isolation latch corresponds to one of the plurality of primary columns, wherein each first isolation latch has a first output state and a second output state;

a plurality of second isolation latches, wherein each second isolation latch corresponds to one of the plurality of redundant columns, wherein each second isolation latch has a third output state and a fourth output state; and one or more control circuits in communication with the memory structure, the plurality of first isolation latches, and the plurality of second isolation latches, wherein the one or more control circuits are configured to:

during a first phase of a column redundancy load, simultaneously reset all of the first isolation latches to the first output state and reset all of the second isolation latches to the third output state;

access a mapping between each respective defective primary column and one of the redundant columns; and during a second phase of the column redundancy load that follows the first phase, for each respective defective primary column:

set a first isolation latch that corresponds to the defective primary column from the first output state to the second output state while simultaneously setting a second isolation latch that corresponds to a redundant column that maps to the respective defective primary column from the third output state to the fourth output state;

after the column redundancy load, for each first isolation latch:

determine that the corresponding primary column is operational if the first isolation latch is in the first output state and determine that the corresponding primary column is defective if the first isolation latch is in the second output state; and after the column redundancy load, for each second isolation latch:

determine that the corresponding redundant column is a replacement for a defective primary column if the second isolation latch is in the fourth output state and determine that the corresponding redundant column is not used as a replacement for any primary column if the second isolation latch is in the third output state.

16. The non-volatile storage system of claim 15, wherein the one or more control circuits are configured to, during the second phase of the column redundancy load:

access a mapping of a first address of a first defective primary column to a second address of a first redundant column;

select a first isolation latch based on the first address;

select a second isolation latch based on the second address; and issue a set pulse in parallel to the selected first isolation latch and to the selected second isolation latch to set the selected first isolation latch from the first output state to the second output state in parallel with simultaneously setting the selected second isolation latch from the third output state to the fourth output state.

17. The non-volatile storage system of claim 15, wherein the one or more control circuits are configured to, during the first phase of the column redundancy load:

apply a common reset signal to each first isolation latch and each second isolation latch to simultaneously reset each first isolation latch to the first output state and reset each second isolation latch to the third output state.

18. The non-volatile storage system of claim 15, wherein:

the plurality of first isolation latches comprise a plurality of set/reset latches, each set/reset latch comprise a set input, a reset input, a Q output, and a QBAR output, the plurality of second isolation latches comprise a plurality of set/reset latches, each set/reset latch comprise a set input, a reset input, a Q output, and a QBAR output; and the one or more control circuits are configured to apply a common reset pulse to the reset inputs of the respective first isolation latches and the reset inputs of the respective second isolation latches to simultaneously reset the first and second first isolation latches during the first phase of the column redundancy load.

19. The non-volatile storage system of claim 15, wherein:

the plurality of first isolation latches comprise a plurality of set/reset latches, each set/reset latch comprise a set input, a reset input, a Q output, a QBAR output, and a set select input;

the plurality of second isolation latches comprise a plurality of set/reset latches, each set/reset latch comprise a set input, a reset input, a Q output, and a QBAR output, and a set select input;

the one or more control circuits are configured to apply a select signal to the set select input of a selected first isolation latch while applying a select signal to the set select input of a selected second isolation latch during the second phase of the column redundancy load; and the one or more control circuits are configured to issue a set pulse in parallel to the selected first isolation latch and to the selected second isolation latch to set the selected first isolation latch from the first output state to the second output state in parallel with setting the selected second isolation latch from the third output state to the fourth output state during the second phase of the column redundancy load.

20. The non-volatile storage system of claim 15, wherein the one or more control circuits are configured to perform memory operations after the column redundancy load, wherein during the memory operations the one or more control circuits:
  read the plurality of first isolation latches to determine whether the corresponding primary column is to be used for the memory operations; and
  read the plurality of second isolation latches to determine whether the corresponding redundant column is to be used for the memory operations, including provide an opposite determination if second isolation latch is in the third output state to which the second isolation latch were reset than if a first isolation latch is in the first output state to which the first isolation latch were reset.

* * * * *